US012777767B2

(12) United States Patent
Zhang et al.

(10) Patent No.: US 12,777,767 B2
(45) Date of Patent: Oct. 27, 2026

(54) DISPLAY PANEL AND DISPLAY DEVICE

(71) Applicant: BOE Technology Group Co., Ltd., Beijing (CN)

(72) Inventors: Chenyang Zhang, Beijing (CN); Mingxing Wang, Beijing (CN); Jinye Zhu, Beijing (CN); Lin Li, Beijing (CN); Yifan Song, Beijing (CN); Haoliang Zheng, Beijing (CN); Li Xiao, Beijing (CN); Qi Qi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 355 days.

(21) Appl. No.: 18/702,927

(22) PCT Filed: Nov. 28, 2022

(86) PCT No.: PCT/CN2022/134778
§ 371 (c)(1),
(2) Date: Apr. 19, 2024

(87) PCT Pub. No.: WO2024/113112
PCT Pub. Date: Jun. 6, 2024

(65) Prior Publication Data
US 2025/0268003 A1 Aug. 21, 2025

(51) Int. Cl.
*H10H 29/49* (2025.01)
*H10H 20/812* (2025.01)
(Continued)

(52) U.S. Cl.
CPC .......... *H10H 29/49* (2025.01); *H10H 20/812* (2025.01); *H10H 29/142* (2025.01); *H10H 29/41* (2025.01); *H10W 90/00* (2026.01)

(58) Field of Classification Search
CPC ...... H10H 29/49; H10H 29/142; H10H 29/41; H10H 20/812; H10W 90/00; G90F 9/33
See application file for complete search history.

(56) References Cited

U.S. PATENT DOCUMENTS

2018/0061894 A1* 3/2018 Kim ...................... G03F 7/0007
2019/0305000 A1 10/2019 Lin et al.
(Continued)

FOREIGN PATENT DOCUMENTS

CN 104269428 A 1/2015
CN 107968101 A 4/2018
(Continued)

OTHER PUBLICATIONS

U.S. Appl. No. 92/369,504, filed Mar. 2, 2006, Brody et al.

*Primary Examiner* — Dao H Nguyen
(74) *Attorney, Agent, or Firm* — Workman Nydegger

(57) ABSTRACT

A display panel and a display device, including: a driving backplane, including a substrate, one or more driving circuits arranged in an array on the substrate, and one or more positive pads arranged on a side of the driving circuits facing away from the substrate; one or more pixel islands on the driving backplane, the pixel island including one or more first sub-pixels; one or more first electrode pad sets between the pixel islands and the driving backplane, and an orthographic projection of a first electrode pad set on the substrate being located in an orthographic projection of a corresponding pixel island on the substrate; the first electrode pad set including one or more first electrode pads, and the first electrode pads being bonded and connected to the positive pads.

20 Claims, 17 Drawing Sheets

(51) Int. Cl.

| | |
|---|---|
| ***H10H 29/14*** | (2025.01) |
| ***H10H 29/41*** | (2025.01) |
| ***H10W 90/00*** | (2026.01) |

(56) References Cited

U.S. PATENT DOCUMENTS

| | | | | |
|---|---|---|---|---|
| 2020/0075689 | A1* | 3/2020 | Matsueda | H10K 59/353 |
| 2021/0043131 | A1 | 2/2021 | Wu et al. | |
| 2021/0151650 | A1* | 5/2021 | Wu | G09G 3/32 |
| 2021/0167045 | A1 | 6/2021 | Meng et al. | |
| 2021/0358963 | A1* | 11/2021 | Wu | G06F 1/1637 |
| 2024/0138212 | A1* | 4/2024 | Saitoh | G09F 9/30 |
| 2026/0143943 | A1* | 5/2026 | Okazaki | H10K 59/38 |

FOREIGN PATENT DOCUMENTS

| | | | |
|---|---|---|---|
| CN | 110246450 | A | 9/2019 |
| CN | 111599306 | A | 8/2020 |
| CN | 113383263 | A | 9/2021 |
| CN | 113703211 | A | 11/2021 |
| CN | 113809064 | A | 12/2021 |
| CN | 114023763 | A | 2/2022 |
| CN | 115101650 | A | 9/2022 |
| JP | 2012255873 | A | 12/2012 |

* cited by examiner

DISPLAY PANEL AND DISPLAY DEVICE

CROSS REFERENCE TO RELATED APPLICATIONS

The present application is a National Stage of International Application No. PCT/CN2022/134778, filed on Nov. 28, 2022, the entire contents of which are incorporated by reference in the present application.

TECHNICAL FIELD

The present disclosure relates to the field of display technology, in particular to a display panel and display device.

BACKGROUND

The light-emitting diode (LED) display technology, as a new display technology, compared with the liquid crystal display (LCD) and organic light-emitting diode (OLED) display, has obvious advantages in display image quality, refresh frequency, power consumption and brightness, which makes the LED display have a wide range of applications. For example, the LED display can be applied to the traditional display, near-eye display, 3D display and transparent display, etc. However, due to limitations of the mass transfer technology, the LED display is subject to certain constraints, especially for high resolution (PPI) display.

Light-emitting diode chips can include a mini light emitting diode (Mini LED) chip and a micro light emitting diode (Micro LED) chip. Subdividing a Mini LED pixel island, i.e., etching a P electrode and P-type semiconductor layer in the Mini LED pixel island, realizes to subdivide a single Mini LED pixel island into multiple sub-pixels, and each sub-pixel is of Micro LED level size, and the subdivided Mini LED pixel island can realize high PPI display. The subdivided Mini LED pixel island needs to be transferred to a driving backplane to form a LED display panel for display.

SUMMARY

Embodiments of the present disclosure provide a display panel and display device, and the specific schemes are as follows.

Embodiments of the present disclosure provide a display panel, including a display region, where in the display region, the display panel includes: a driving backplane including a substrate, a plurality of driving circuits arranged in array on the substrate, and a plurality of positive pads arranged on a side of the driving circuits facing away from the substrate; a plurality of pixel islands on the driving backplane, wherein each pixel island includes a plurality of first sub-pixels with the same color; and a plurality of first electrode pad sets between the plurality of pixel islands and the driving backplane, wherein the first electrode pad sets is in a one-to-one correspondence with the pixel islands an orthographic projection of a first electrode pad set on the substrate is located in an orthographic projection of a pixel island corresponding to the first electrode pad set on the substrate, each first electrode pad set includes a plurality of first electrode pads, and the first electrode pads is bonded and connected to the positive pads; where a number of rows of first electrode pads in each first electrode pad set is greater than a number of rows of first sub-pixels in each pixel island, and a number of columns of first electrode pads in each first electrode pad set is less than a number of columns of first sub-pixels in each pixel island; and the first electrode pads are electrically connected to the first sub-pixels through first leads, and the positive pads are electrically connected to the driving circuits through second leads.

In a possible implementation, in the above display panel provided in the embodiments of the present disclosure, the plurality of positive pads are divided into a plurality of positive pad sets, and the positive pad sets are in a one-to-one correspondence with the first electrode pad sets; and the plurality of driving circuits are divided into a plurality of driving circuit sets, the driving circuit sets are in a one-to-one correspondence with the positive pad sets, and an area of an orthographic projection of each positive pad set on the substrate is smaller than an area of an orthographic projection of a driving circuit set on the substrate.

In a possible implementation, in the above display panel provided in the embodiments of the present disclosure, an orthographic projection of a second lead on the substrate is located in an orthographic projection of a gap between two adjacent rows of first sub-pixels on the substrate, and/or an orthographic projection of a second lead on the substrate is located in an orthographic projection of a gap between two adjacent columns of first sub-pixels on the substrate.

In a possible implementation, in the above display panel provided in the embodiments of the present disclosure, at least part of the second leads have an overlapping region with other second leads, and for two second leads having the overlapping region, one of the two second leads is bridged by a bridging portion at the overlapping region.

In a possible implementation, in the above display panel provided in the embodiments of the present disclosure, the driving backplane further includes a first insulating layer, a first metal layer, a second insulating layer, and a second metal layer sequentially stacked between the driving circuits and the positive pads, and the first insulating layer is close to the driving circuit; where a part of the second leads are arranged in the first metal layer; and another part of the second leads include first sub-leads, bridging portions and second sub-leads, the first sub-leads and the second sub-leads are both arranged in the first metal layer, and the bridging portions are arranged in the second metal layer; where one end of a first sub-lead is electrically connected to the driving circuit through a via hole penetrating the first insulating layer and an other end of the first sub-lead is electrically connected to one end of a bridging portion through a via hole penetrating the second insulating layer, and one end of a second sub-lead is electrically connected to an other end of the bridging portion through a via hole penetrating the second insulating layer and an other end of the second sub-lead is electrically connected to a positive pad.

In a possible implementation, in the above display panel provided in the embodiments of the present disclosure, the driving backplane further includes: a first planarization layer between the second metal layer and the positive pads, and a third insulating layer between the first planarization layer and the positive pads; and the other end of the second sub-lead is electrically connected to the positive pad through a via hole sequentially penetrating the second insulating layer, the first planarization layer and the third insulating layer.

In a possible implementation, in the above display panel provided in the embodiments of the present disclosure, each first sub-pixel includes a first electrode, a first semiconductor layer, a quantum well layer, a second semiconductor layer, and a second electrode that are stacked, and the first electrode is close to the driving backplane; the display panel further includes a fourth insulating layer between the first electrode and the first electrode pad, one end of the first lead is electrically connected to the first electrode pad, and the other end of the first lead is electrically connected to the first electrode through a via hole penetrating the fourth insulating layer.

In a possible implementation, in the above display panel provided in the embodiments of the present disclosure, the first electrode pad is provided in the same one layer as the first lead.

In a possible implementation, in the above display panel provided in the embodiments of the present disclosure, quantum well layers of the first sub-pixels in the same pixel island are an integrated structure, second semiconductor layers of the first sub-pixels in the same pixel island are an integrated structure, and second electrodes of the first sub-pixels in the same pixel island are an integrated structure.

In a possible implementation, in the above display panel provided in the embodiments of the present disclosure, the display panel further includes second electrode pads provided in the same one layer as the first electrode pads, where second electrodes in the same one pixel island are electrically connected to the same one second electrode pad, and second electrodes in different pixel islands are electrically connected to different second electrode pads.

In a possible implementation, in the above display panel provided in the embodiments of the present disclosure, the second electrode pads are located in a region between two adjacent columns of first electrode pad sets.

In a possible implementation, in the above display panel provided in the embodiments of the present disclosure, the driving backplane further includes negative pads arranged in the same one layer as the positive pads, and the negative pads are bonded and connected to the second electrode pads.

In a possible implementation, in the above display panel provided in the embodiments of the present disclosure, the driving backplane further includes: a fifth insulating layer on a side of the positive pads facing away from the substrate, and a second planarization layer on a side of the fifth insulating layer facing away from the substrate; the fifth insulating layer and the second planarization layer have a first exposed region exposing the positive pads and a second exposed region exposing the negative pads, and the first electrode pads are bonded and connected to the positive pads through the first exposed region and the second electrode pads are bonded and connected to the negative pads through the second exposed region.

In a possible implementation, in the above display panel provided in the embodiments of the present disclosure, each driving circuit includes a first gate, a first gate insulating layer, an active layer, a second gate insulating layer, a second gate, an interlayer insulating layer, and source and drain electrodes sequentially stacked between the substrate and the first insulating layer; one end of the first sub-lead is electrically connected to the drain electrode of the driving circuit through the via hole penetrating the first insulating layer, the drain electrode is electrically connected to the active layer, and the source electrode of the driving circuit is electrically connected to the first gate and the second gate.

In a possible implementation, in the above display panel provided in the embodiments of the present disclosure, the driving backplane further includes: a first conductive connection portion and a second conductive connection portion arranged in the first metal layer, a low-voltage power line and a high-voltage power line arranged in the same one layer as the source and drain electrodes, a third conductive connection portion and a fourth conductive connection portion arranged in the same one layer as the second gate, and a shielding electrode arranged in the same one layer as the first gate; and the negative pad is electrically connected to the first conductive connection portion through a via hole penetrating the third insulating layer, the first planarization layer and the second insulating layer, the first conductive connection portion is electrically connected to the low-voltage power line through a via hole penetrating the first insulating layer, the low-voltage power line is electrically connected to the third conductive connection portion through a via hole penetrating the interlayer insulating layer, the second conductive connection portion is electrically connected to the high-voltage power line through a via hole penetrating the first insulating layer, the high-voltage power line is electrically connected to the fourth conductive connection portion through a via hole penetrating the interlayer insulating layer, and the high-voltage power line is electrically connected to the shielding electrode through a via hole penetrating the interlayer insulating layer, the second gate insulating layer and the first gate insulating layer.

In a possible implementation, in the above display panel provided in the embodiments of the present disclosure, the plurality of pixel islands are arranged at intervals along a row direction and a column direction, the negative pads electrically connected to the pixel islands in the same one column are electrically connected to the same one low-voltage power line, the driving circuits electrically connected to the pixel islands in the same one column are electrically connected to the same one high-voltage power line, and one high-voltage power line and one low-voltage power line is provided at a gap between two adjacent columns of pixel islands.

In a possible implementation, in the above display panel provided in the embodiments of the present disclosure, the display panel includes a plurality of rows and columns of pixel units with different light-emitting colors, where the pixel units in the same one row have the same light-emitting color, and the pixel units with different light-emitting colors in the same one column are arranged alternately; and each pixel unit includes at least two pixel islands arranged at intervals, the at least two pixel islands in each pixel unit are staggered in a row direction, and outermost adjacent first sub-pixels of adjacent pixel islands in each pixel unit are staggered in the row direction.

In a possible implementation, in the above display panel provided in the embodiments of the present disclosure, the plurality of first sub-pixels in each pixel island are arranged at intervals along the row direction and a column direction, each row of first sub-pixels in each pixel island are sequentially staggered along the row direction, and a distance between adjacent first sub-pixels in the same one row is smaller than a width of the first sub-pixel along the row direction.

In a possible implementation, in the above display panel provided in the embodiments of the present disclosure, a distance between centerlines of any two adjacent first sub-pixels along the column direction is equal.

In a possible implementation, in the above display panel provided in the embodiments of the present disclosure, the display panel further includes a gate driver on array (GOA) driving circuit, an emission circuit on array (EOA) driving circuit, and a multiplexer (MUX) circuit, where the GOA driving circuit and the EOA driving circuit are arranged between adjacent two different columns of pixel units respectively, and the MUX circuit is arranged between two adjacent rows of pixel units.

In a possible implementation, in the above display panel provided in the embodiments of the present disclosure, the pixel islands include mini light-emitting diode (LED) pixel islands.

Correspondingly, embodiments of the present disclosure further provide a display device, including at least one of the above display panels provided in the embodiments of the present disclosure.

In a possible implementation, in the above display device provided in the embodiments of the present disclosure, the display device further includes a plurality of lenses on a light emergent side of the display panel; the plurality of lenses are in a one-to-one correspondence with the plurality of pixel islands, or the plurality of lens are in a one-to-one correspondence with the first sub-pixels in each pixel island; and light emitted from each first sub-pixel in each pixel island is incident to a corresponding lens.

In a possible implementation, in the above display device provided in the embodiments of the present disclosure, the display panel further includes a splicing region surrounding the display region, the display device includes at least two display panels arranged that are spliced, and splicing regions of the at least two display panels are provided with a plurality of second sub-pixels arranged in the same manner as the first sub-pixels.

DETAILED DESCRIPTION

In order to make the objects, technical solutions and advantages of the embodiments of the present disclosure clearer, the technical solutions of the embodiments of the present disclosure will be described clearly and completely in the following in conjunction with the accompanying drawings of the embodiments of the present disclosure. Obviously, the described embodiments are a part, but not all of the embodiments of the present disclosure. And the embodiments and the features in the embodiments of the present disclosure can be combined with each other without conflict. Based on the described embodiments of the present disclosure, all other embodiments obtained by a person of ordinary skill in the art without the need for creative labor fall within the protection scope of the present disclosure.

Unless otherwise defined, technical terms or scientific terms used in the present disclosure shall have the ordinary meaning understood by a person of ordinary skill in the field to which the present disclosure belongs. The word "including" or "comprising" and the like as used in the present disclosure are intended to that an element or object appearing before the word covers an element or object appearing after the word and its equivalents, without excluding other elements or objects. The word such as "connected" or "connecting" is not limited to physical or mechanical connections, but may include electrical connections, whether direct or indirect. The words "inside", "outside", "above", "below", etc., are only used to indicate relative positional relationships. When the absolute position of the depicted object is changed, the relative positional relationship may also be changed accordingly.

It should be noted that the sizes and shapes of the figures in the accompanying drawings do not reflect true proportions and are intended to illustrate the present disclosure only. And the same or similar labeling throughout denotes the same or similar elements or elements having the same or similar function.

Figure 1:
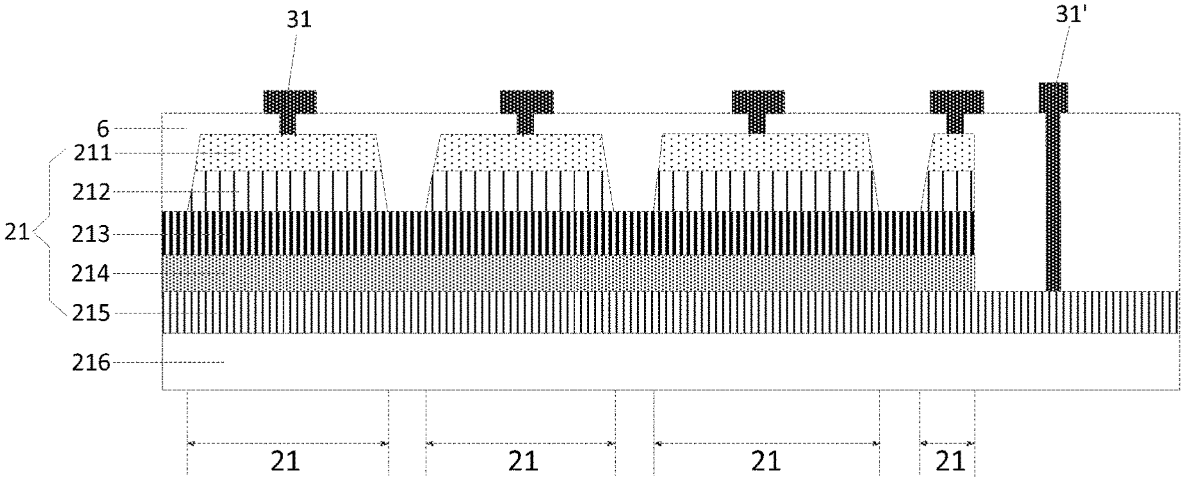
FIG. 1 is a schematic structural diagram of subdividing a Mini LED pixel island into first sub-pixels in the related art.

As shown in FIG. 1, FIG. 1 is a schematic structural diagram of subdividing a Mini LED pixel island into first sub-pixels in the related art. A Mini LED pixel island can be subdivided into multiple first sub-pixels 21, which can be specifically as follows: a P electrode layer of a Mini LED chip is divided into multiple first electrodes 211 of the first sub-pixels 21 by an etching process, a P-type semiconductor layer is divided into multiple first semiconductor layers 212 of the first sub-pixels 21, and the multiple first sub-pixels 21 may share an N-type semiconductor layer (second semiconductor layer 214) and a multiple quantum well (MQW) layer 213, so as to realize that a Mini LED pixel island is subdivided into a plurality of first sub-pixels 21, and each of the first sub-pixels 21 is of a Micro LED level size. The Mini LED pixel island which is subdivided into the first sub-pixels 21 needs to be transferred to a driving backplane of a glass substrate, where a P electrode pad (first electrode pad 31) of each of the first sub-pixels and a common N electrode pad (second electrode pad 31') of the Mini LED pixel island are bonded and connected to the positive pad and the negative pad, respectively, which are reserved on the driving backplane.

Figure 2:
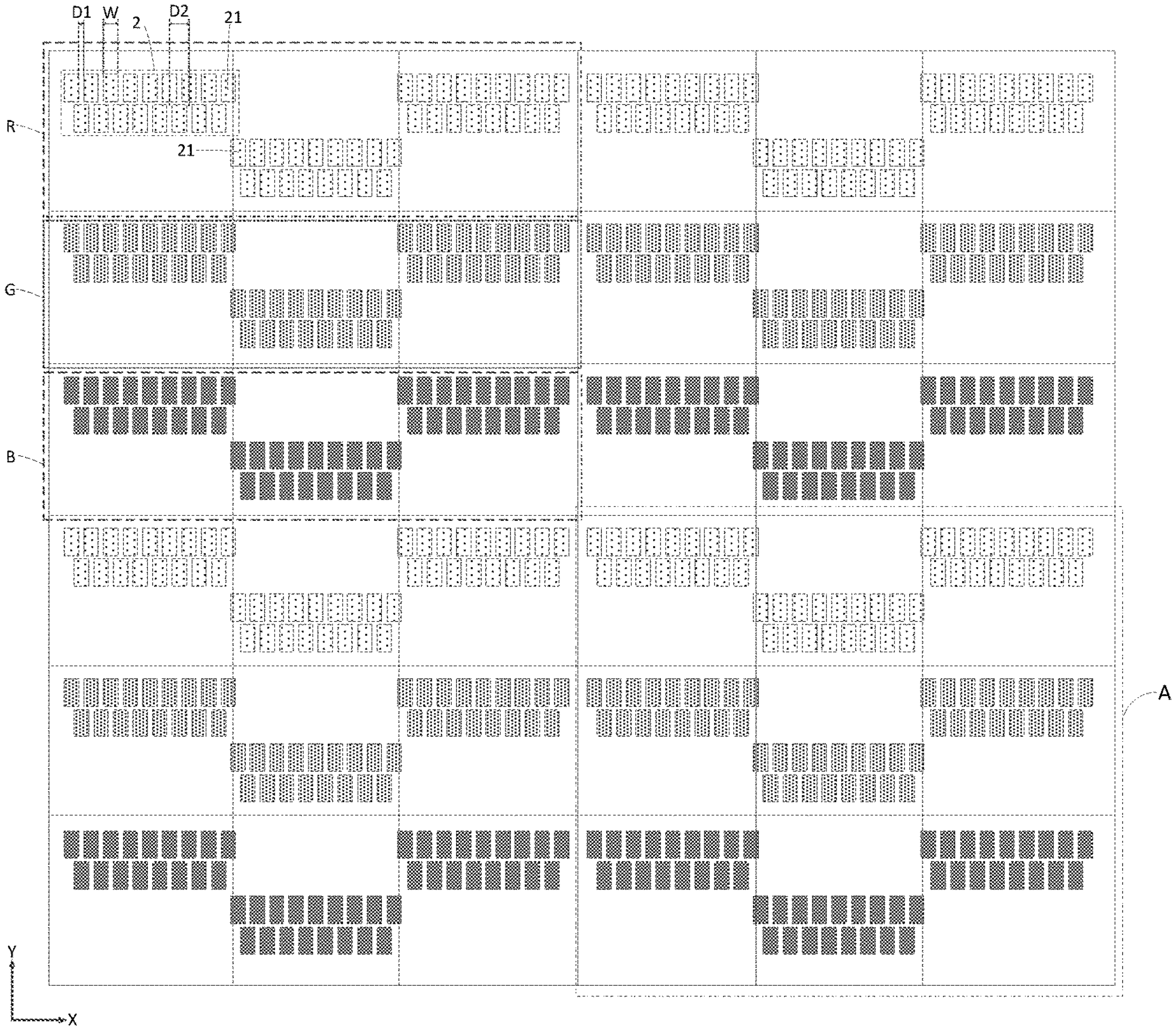
FIG. 2 is a schematic plane diagram of each Mini LED pixel island in a display panel provided by embodiments of the present disclosure.
Figure 3:
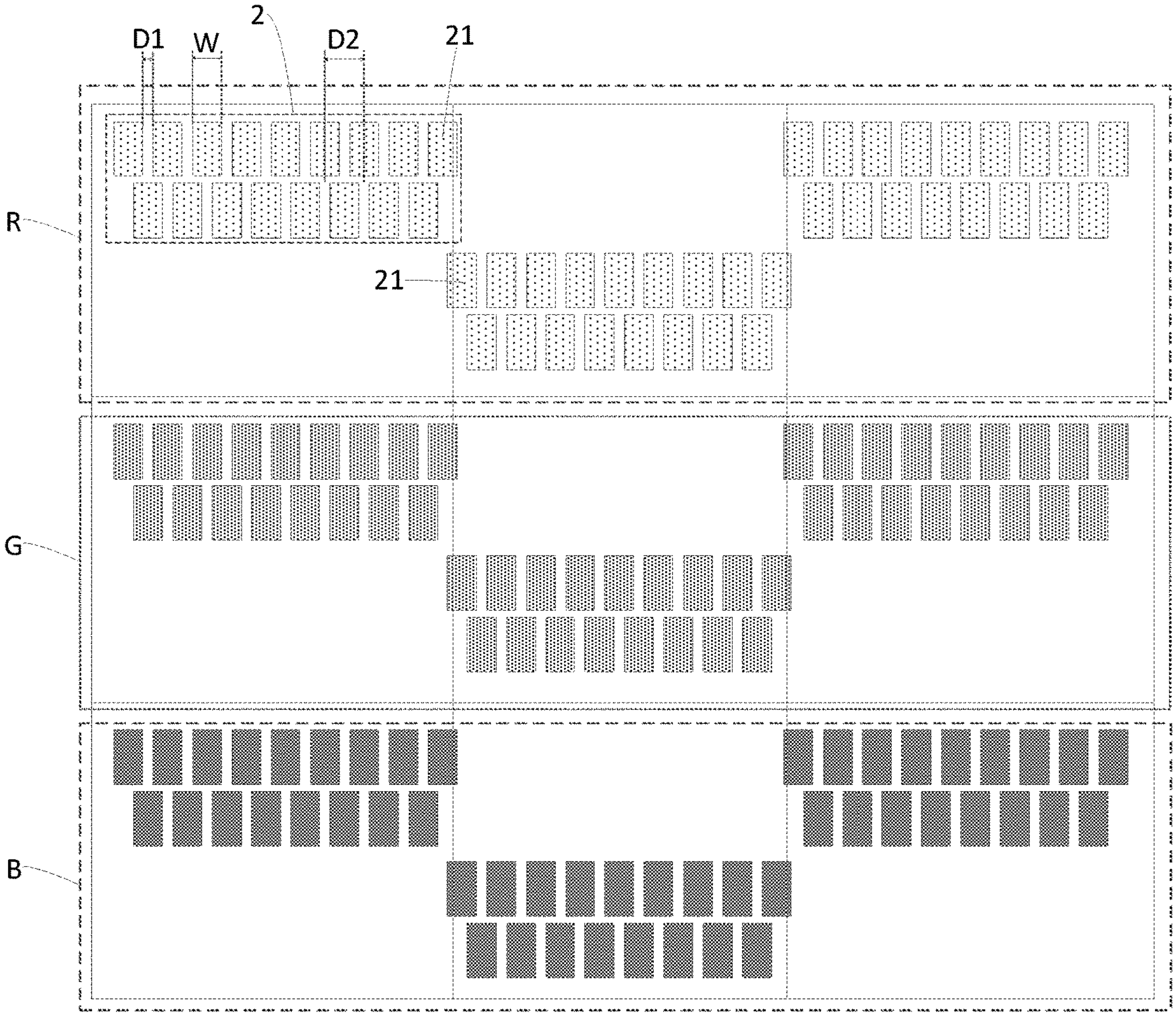
FIG. 3 is an enlarged schematic diagram in a dashed box A in FIG. 2.

In the related art, a plurality of first sub-pixels with the same light-emitting color in the same one row are usually treated as one pixel island, and since the pixel island needs to be transferred to the driving backplane, it undoubtedly increases the difficulty of alignment in the transfer process. As shown in FIGS. 2 and 3, FIG. 2 is a schematic plane diagram of each Mini LED pixel island in a display panel provided by embodiments of the present disclosure, and FIG. 3 is an enlarged schematic diagram in a dashed box A in FIG. 2, including multiple rows and multiple columns of pixel units (R, G, B) of different light-emitting colors, where the respective pixel units in the same one row have the same light-emitting color, and the respective pixel units (R, G, B) in the same one column of different light-emitting colors are arranged alternately, for example, the pixel units in the same one column are provided in an arrangement of R, G, B, R, G, B, R, G, B, . . . ; each pixel unit (e.g., R) includes at least two pixel islands 2 arranged at intervals (taking three pixel islands as an example), and at least two pixel islands 2 in each pixel unit (e.g., R) are staggered in a row direction X, and the outermost adjacent first sub-pixels 21 of adjacent pixel islands 2 in each pixel unit (e.g., R) are staggered along the row direction X. The arrangement of the pixel islands 2 shown in FIG. 2 provided by the embodiments of the present disclosure can reduce the difficulty of alignment when the pixel islands 2 are transferred to the driving backplane for bonding connection.

Figure 4:
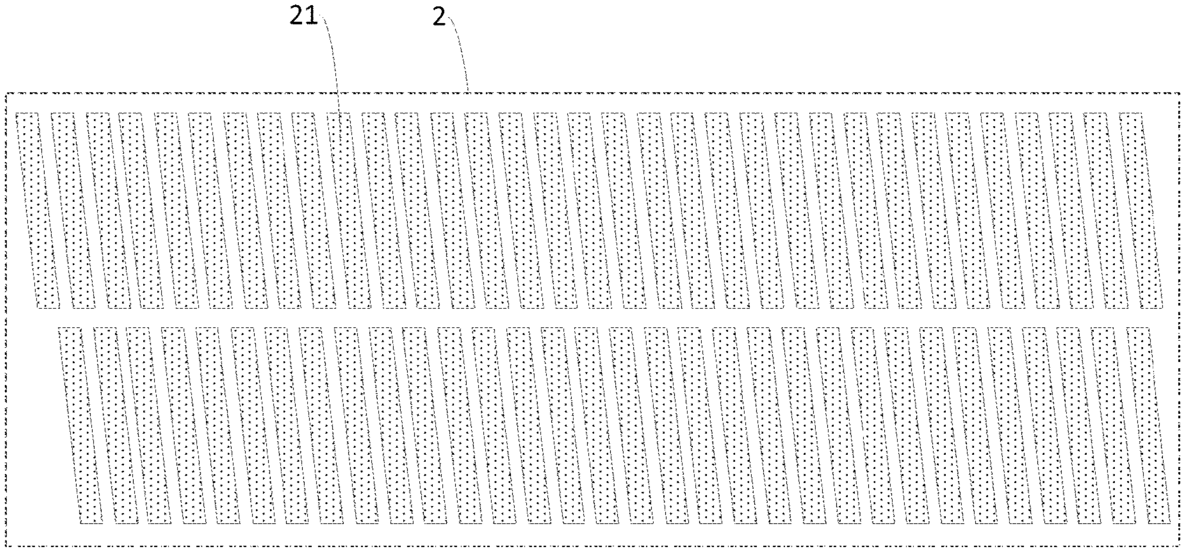
FIG. 4 is a schematic plane diagram of one pixel island in FIG. 3.

FIG. 2 is an example of each pixel island 2 being subdivided into 17 first sub-pixels 21. In actual fabrication, the number of first sub-pixels 21 subdivided in each pixel island 2 is more. For example, as shown in FIG. 4, each pixel island 2 is subdivided into 65 sub-pixels 21, and theoretically, one P electrode pad as shown in FIG. 1 is required to be provided vertically above each first sub-pixel 21 correspondingly, but since a distance between the subdivided first sub-pixels 21 along the row direction X in each pixel island 2 is very small and is generally less than 10 μm, and a width of the P electrode pad of each first sub-pixel 21 is generally larger than a width of a P electrode, it is not sufficient to make the P electrode pads be in a one-to-one correspondence with the first sub-pixels 21 vertically above the first sub-pixels 21. Furthermore, the P electrode pads are bonded and connected to positive pads on the driving backplane in a one-to-one correspondence, and the positive pads on the driving backplane need to be electrically connected in a one-to-one correspondence with driving circuits, and since the number of first sub-pixels 21 subdivided in each pixel island 2 is larger, the number of driving circuits on the driving backplane also increases, and the driving circuits take up a larger area, it is not possible to fabricate the respective positive pads vertically above the respective driving circuits either. Therefore, for the current scheme in which each pixel island is subdivided into a number of first sub-pixels, how to realize an effective bonding connection between the pixel island and the driving backplane is an urgent problem to be solved by those skilled in the art.

Figure 5:
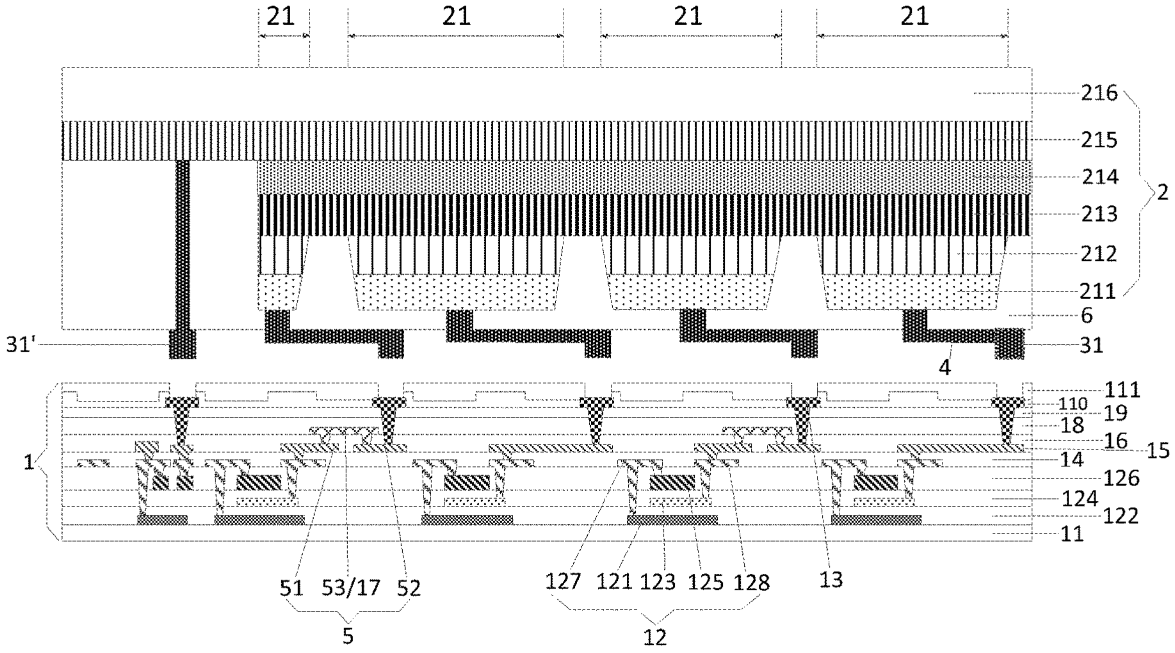
FIG. 5 is a schematic sectional diagram corresponding to one pixel island in a display panel provided by embodiments of the present disclosure.
Figure 6:
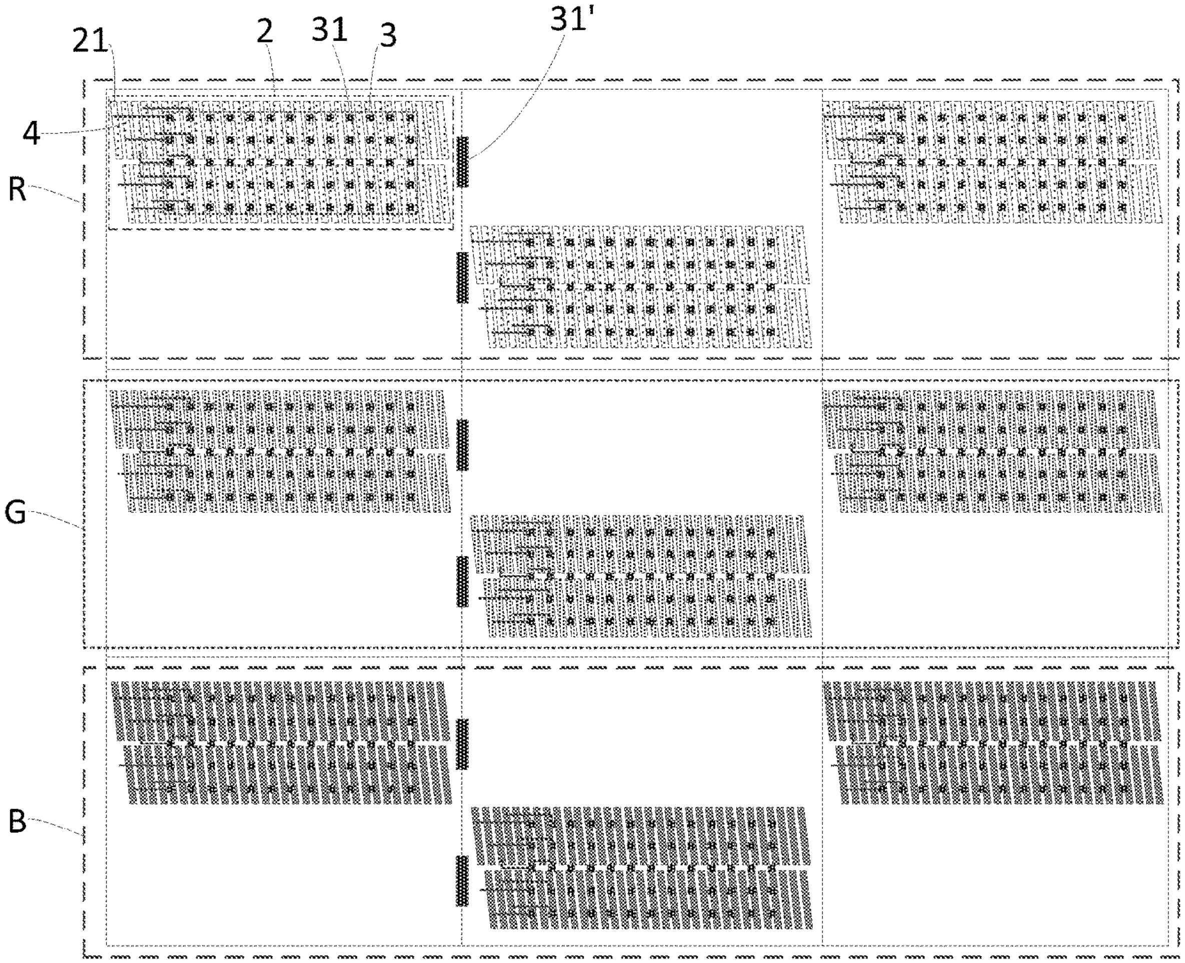
FIG. 6 is a schematic plane diagram of a specific film layer in the pixel island corresponding to three pixel units (R, G, B) in FIG. 2.
Figure 7:
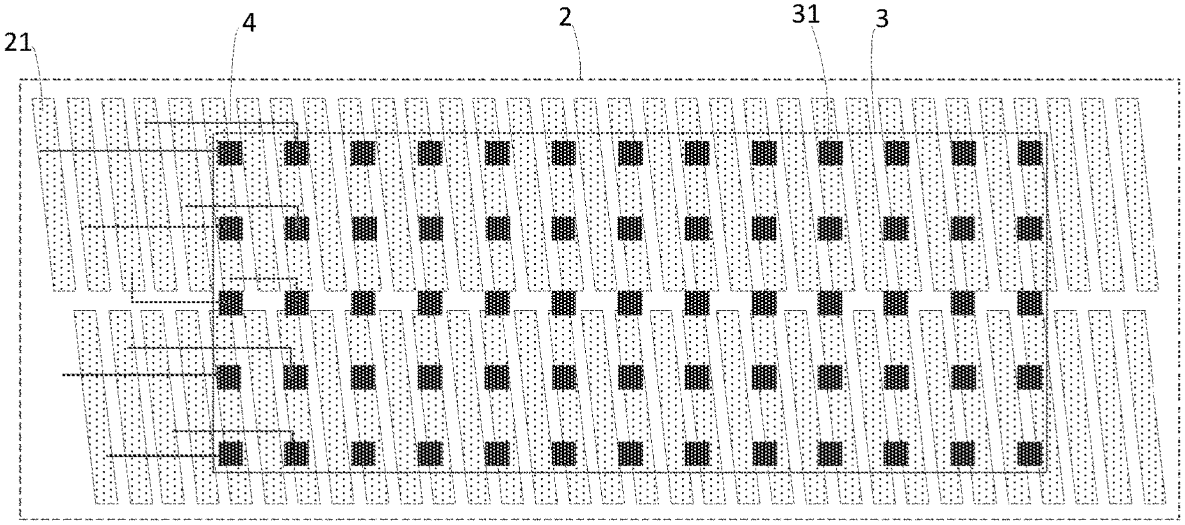
FIG. 7 is a schematic plane diagram corresponding to one pixel island in FIG. 6.
Figure 8:
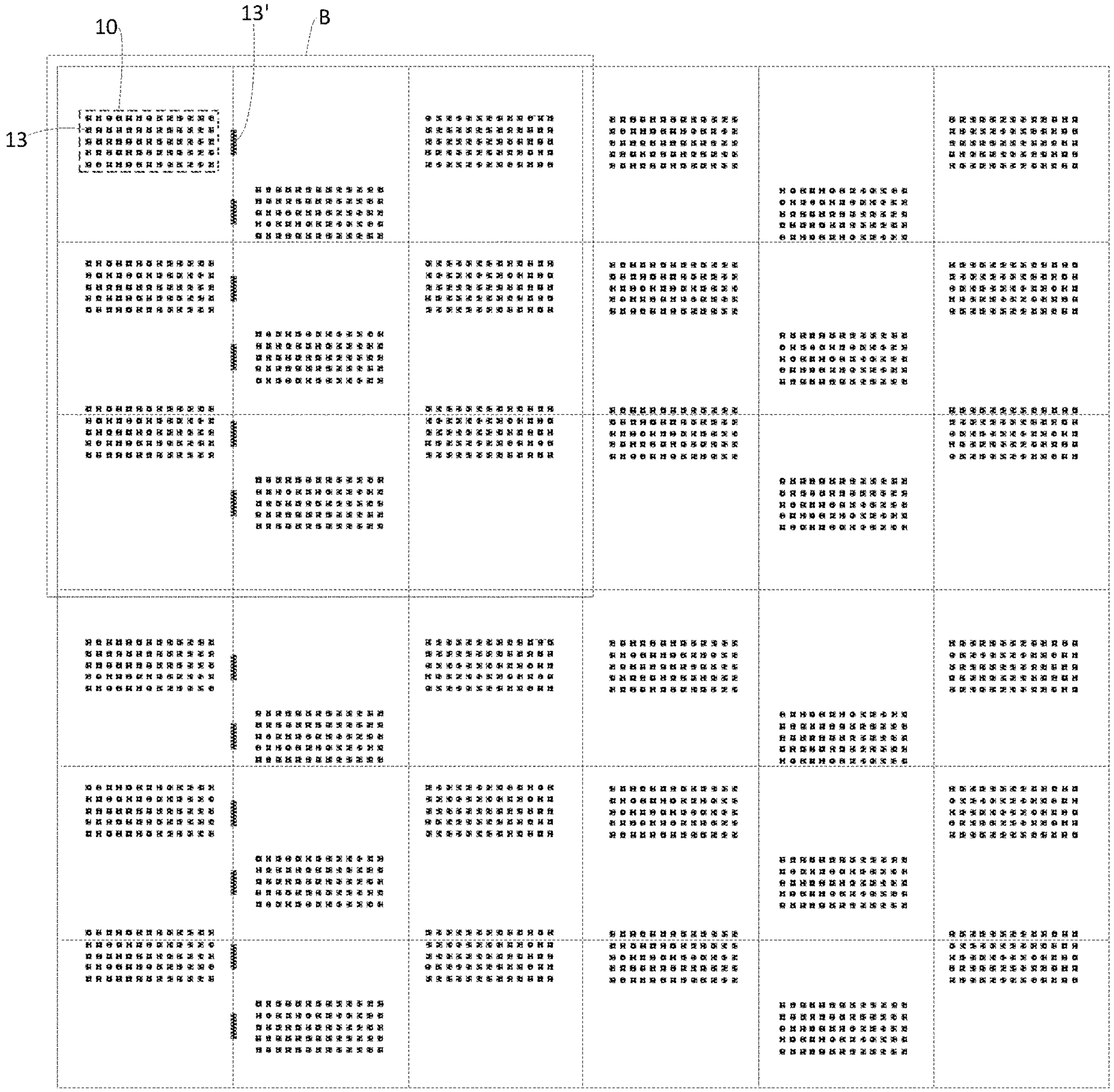
FIG. 8 is a schematic plane diagram of a part of film layers in a driving backplane corresponding to the pixel island in FIG. 2.
Figure 9:
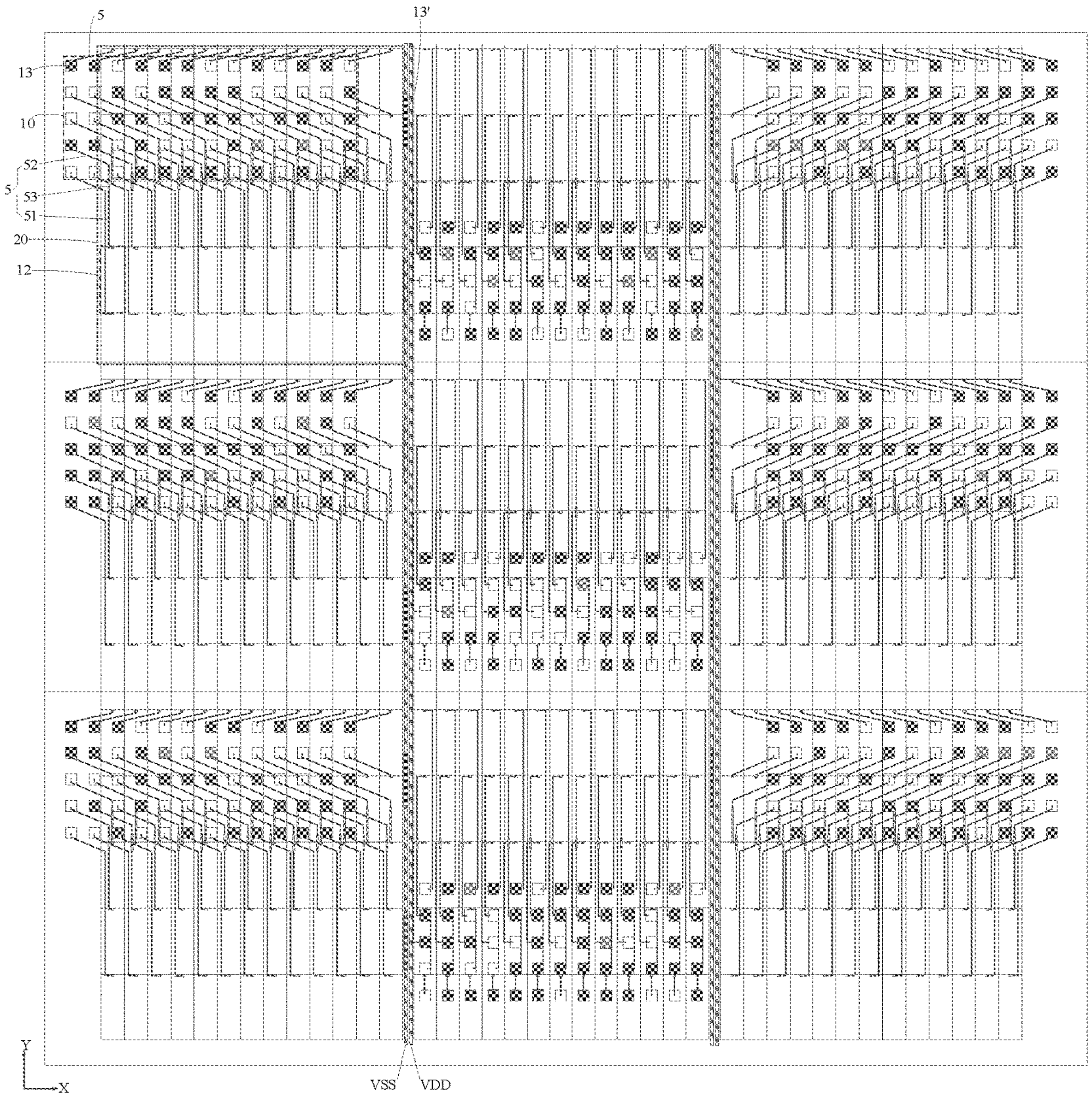
FIG. 9 is an enlarged schematic diagram in a dashed box B in FIG. 8.
Figure 10:
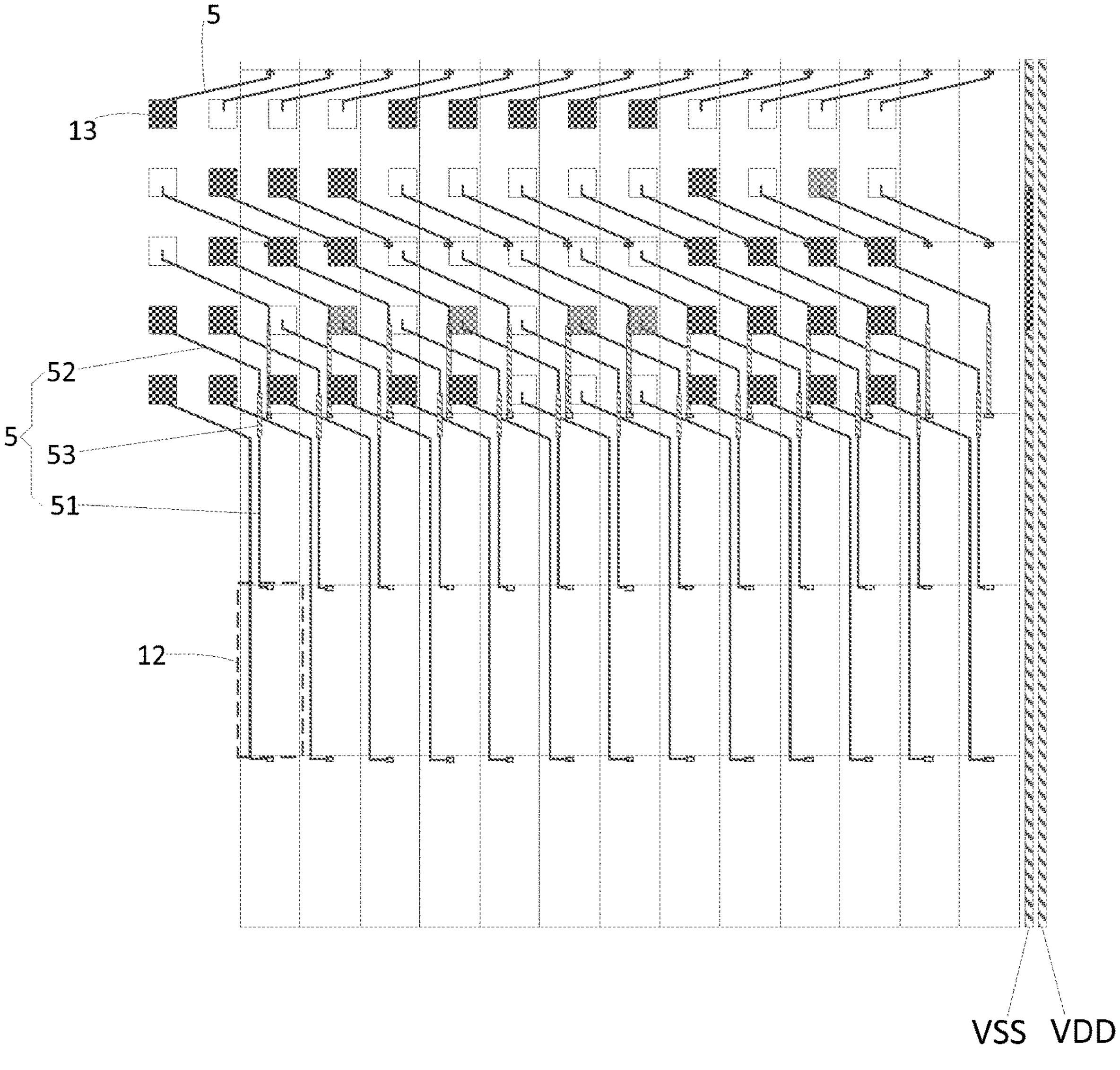
FIG. 10 is a partially enlarged schematic diagram in FIG. 9.

In view of this, embodiments of the present disclosure provide a display panel having a display region, as shown in FIG. 2 and FIGS. 5 to 10, where FIG. 2 and FIGS. 5 to 10 only illustrate the display region, FIG. 5 is a schematic sectional diagram corresponding to one pixel island in the display panel, FIG. 6 is a schematic plane diagram of a specific film layer in the pixel island corresponding to three pixel units (R, G, B) in FIG. 2 (taking the number of first sub-pixels subdivided in one pixel island being 65 as an example), FIG. 7 is a schematic plane diagram corresponding to one pixel island in FIG. 6, FIG. 8 is a schematic plane diagram of a part of film layers in a driving backplane corresponding to the pixel island in FIG. 2, FIG. 9 is an enlarged schematic diagram in a dashed box B in FIG. 8, and FIG. 10 is a partially enlarged schematic diagram in FIG. 9. The display region of the display panel includes: a driving backplane 1, as shown in FIG. 5, and FIGS. 8 to 10, including a substrate 11, a plurality of driving circuits 12 arranged in array on the substrate 11, and a plurality of positive pads 13 arranged on a side of the driving circuits 12 facing away from the substrate 11; a plurality of pixel islands 2, as shown in FIG. 2 and FIGS. 5 to 7, arranged on the driving backplane 1, each pixel island 2 including a plurality of first sub-pixels 21 with the same color; and a plurality of first electrode pad sets 3, as shown in FIGS. 5 to 7, between the plurality of pixel islands 2 and the driving backplane 1, the first electrode pad sets 3 being in a one-to-one correspondence with the pixel islands 2 and an orthographic projection(s) of the first electrode pad set(s) 3 on the substrate 11 being located in an orthographic projection(s) of the corresponding pixel island(s) 2 on the substrate 11; each the first electrode pad set 3 including a plurality of first electrode pads 31, and the first electrode pad(s) 31 being bonded and connected to the positive pad(s) 13.

Here, as shown in FIGS. 6 and 7, the number of rows of first electrode pads 31 in each first electrode pad set 3 is greater than the number of rows of first sub-pixels 21 in each pixel island 2, and the number of columns of first electrode pads 31 in each first electrode pad set 3 is less than the number of columns of first sub-pixels 21 in each pixel island 2.

As shown in FIGS. 5 to 7, the first electrode pad 31 is electrically connected to the first sub-pixel 21 through a first lead 4; and as shown in FIG. 5, FIG. 9 and FIG. 10, the positive pads 13 are electrically connected to the driving circuits 12 through a second lead(s) 5.

In the above-mentioned display panel provided in the embodiments of the present disclosure, the number of rows of first electrode pads 31 in the first electrode pad set 3 corresponding to each pixel island 2 is set to be greater than the number of rows of first sub-pixels 21 in each pixel island 2, and the number of columns of first electrode pads 31 in the first electrode pad set 3 corresponding to each pixel island 2 is set to be less than the number of columns of first sub-pixels 21 in each pixel island 2, so as to rearrange the plurality of first electrode pads 31 originally required to be provided one-to-one correspondingly above the first sub-pixels 21 in each pixel island 2. For example, in the embodiments of the present disclosure, each pixel island 2 includes 65 first sub-pixels which are set in 2 rows, where a first row includes 33 first sub-pixels 21, and a second row includes 32 first sub-pixels. By arranging the 65 first electrode pads 31 corresponding to each pixel island 2 into 5 rows and 13 columns, and electrically connecting each first electrode pad 31 to the corresponding first sub-pixel 21 through the first lead 4, the problem of insufficiently fabricating the first electrode pads 31 in a one-to-one correspondence with the first sub-pixels 21 vertically above the respective first sub-pixels 21 can be solved in the related art.

It should be noted that FIG. 5 illustrates a schematic diagram of the driving backplane 1 and the pixel island 2 after alignment before bonding.

Optionally, as shown in FIGS. 6 and 7, the plurality of first electrode pads 31 corresponding to each pixel island 2 may be equidistantly spaced, and a distance between two adjacent first electrode pads 31 may be the same as or may be different from a distance between adjacent first sub-pixels 21.

It is to be noted that the embodiments of the present disclosure are based on an example that one pixel island is subdivided into 65 first sub-pixels, the 65 first sub-pixels are arranged in two rows, a first row is provided with 33 first sub-pixels, a second row is provided with 32 first sub-pixels, the two rows of first sub-pixels of are arranged in a staggered arrangement in the row direction, and the first electrode pads are arranged in 5 rows and 13 columns. If one pixel island is subdivided into 66 first sub-pixels, the first electrode pads can be arranged in 6 rows and 11 columns, or 3 rows and 22 columns; if one pixel island is subdivided into 61 first sub-pixels, the corresponding 61 first electrode pads cannot be divided into M rows×N columns larger than 2 rows (M needs to be larger than 2), then the first electrode pads can be arranged into 5 rows and 13 columns, and then the last column can only include 1 first electrode pad; and if one pixel island is subdivided into 62 first sub-pixels, the first electrode pads can also be arranged in 5 rows and 13 columns, then the last column may include only 2 first electrode pads. The arrangement of the first electrode pads corresponding to each pixel island may be based on the number of first sub-pixels subdivided in one pixel island.

In specific implementation, since the positive pads of the driving backplane need to be bonded and connected in a one-to-one correspondence to the first electrode pads electrically connected to the pixel islands, the positions of the positive pads corresponding to each pixel island needs to be in a one-to-one correspondence with the first electrode pads corresponding to the pixel island, and since an area occupied by the driving circuits is larger, it is not possible to set the respective positive pads vertically above the respective driving circuits. Therefore, in the above display panel provided in the embodiments of the present disclosure, as shown in FIGS. 8 and 9, the plurality of positive pads 13 are divided into a plurality of positive pad sets 10, and the positive pad sets 10 in FIG. 9 are in a one-to-one correspondence with the first electrode pad sets 3 in FIG. 6.

As shown in FIG. 9, the plurality of driving circuits 12 are divided into a plurality of driving circuit sets 20, the driving circuit sets 20 are in a one-to-one correspondence with the positive pad sets 10, and an area of an orthographic projection of each positive pad set 10 on the substrate 11 is less than an area of an orthographic projection of the driving circuit set 20 on the substrate 11. Specifically, as shown in FIG. 9, since positions of respective positive pad sets 10 needs to be in a one-to-one correspondence with positions of respective first electrode pad sets 3 shown in FIG. 6, and since the driving circuits 12 occupy a large area, each positive pad set 10 occupies only a local region above the corresponding driving circuit set 20. For example, each rectangle represents one driving circuit 12 and multiple driving circuits 12 are evenly distributed on the substrate, and for example, the 65 positive pads 13 in the upper left corner of FIG. 9 need to be bonded and connected in a one-to-one correspondence with the 65 first electrode pads 31 corresponding to the pixel island 2 in the upper left corner of FIG. 6, i.e., the 65 positive pads 13 in the upper left corner of FIG. 9 occupy only a local region above the corresponding driving circuit set 20, i.e., the 65 first electrode pads 31 cannot be set vertically above the driving circuits 12, the 65 first electrode pads 31 need to be electrically connected to the corresponding driving circuits 12 via the second leads 5, which solves the problem of how the positive pads 13 and the driving circuits 12 are electrically connected with each other due to a fact that the positions of the positive pads 13 correspondingly bonded to each pixel island 2 needs to be matched with the positions of the first electrode pads 13, thereby realizing effective bonding connection between the pixel island 2 and the driving backplane 1, and thus independently controlling each first sub-pixel 21 to emit light.

Therefore, in the embodiments of the present disclosure, the respective driving circuits 12 are connected in a one-to-one correspondence to the respective positive pads 13 by the second leads 5, which can realize one-to-one driving of multiple viewpoints during the light field display.

Optionally, the driving circuits may be driving circuits with a compensation function, which may be pulse amplitude modulation (PAM) driving, pulse width modulation (PWM) driving, or PAM+PWM driving, such as 3T1C pixel circuits, 7T1C pixel circuits, and the like. The driving circuits may be in a one-to-one correspondence with the first sub-pixels, or of course, a time-sharing multiplexing circuit in which one driving circuit corresponds to a plurality of first sub-pixels may be provided. The embodiments of the present disclosure are to have the driving circuits in a one-to-one correspondence with the first sub-pixels.

Optionally, the material of the substrate may be made of at least one of polymeric materials, such as polyimide (PI), polyethylene (PE), polypropylene (PP), polyethylene glycol terephthalate (PET), polycarbonate (PC), fiber rein forced Polymer (FRP).

In specific implementation, in the above-mentioned display panel provided in embodiments of the present disclosure, as shown in FIGS. 8-10, since each positive pad set 10 includes 5 rows and 13 columns of positive pads 13, the respective driving circuits 12 correspondingly and electrically connected to the positive pad set 10 are also set in 5 rows and 13 columns. For example, in the 5 rows and 13 columns of positive pads 13, a first row of positive pads 13 are electrically connected to a first row of driving circuits 12 through a corresponding second lead 5, a second row of positive pads 13 are electrically connected to a second row of driving circuits 12 through a corresponding second lead 5, a third row of positive pads 13 are electrically connected to a third row of driving circuits 12 through a corresponding second lead 5, a fourth row of positive pads 13 are electrically connected to a fourth row of driving circuits 12 through a corresponding second lead 5, a fifth row of positive pads 13 are electrically connected to a fifth row of driving circuits 12 through a corresponding second lead 5. In order to avoid the respective second leads 5 from occupying a bezel area, each of the second leads 5 are set to route from a gap between two adjacent rows of first sub-pixels 21 and/or a gap between two adjacent columns of first sub-pixels, so that in the above-mentioned display panel provided by the embodiments of the present disclosure, as shown in FIGS. 9 and 10, an orthographic projection of the second lead 5 on the substrate 11 may be located in an orthographic projection of a gap between two rows of first sub-pixels 21 on the substrate 11, and/or, an orthographic projection of the second lead 5 on the substrate 11 is located in an orthographic projection of a gap between two adjacent columns of first sub-pixels 21 on the substrate 11. For example, an orthographic projection of the second leads 5 corresponding to each of the first row and the second row of positive pads 13 on the substrate 11 is located in an orthographic projection of a gap between two adjacent rows of first sub-pixels 21 on the substrate 11; a portion of the orthographic projection of the second leads 5 corresponding to each of the third to fifth rows of positive pads 13 on the substrate 11 is located in an orthographic projection of a gap between two adjacent rows of first sub-pixels 21 on the substrate 11, and another portion of the orthographic projection of the second leads 5 corresponding to each of the third to fifth rows of positive pads 13 on the substrate 11 is located in an orthographic projection of a gap between two adjacent columns of first sub-pixels 21 on the substrate 11. Of course, an orthographic projection of the second leads 5 on the substrate 11 may also be located in the orthographic projection of the gap between two adjacent rows of first sub-pixels 21 on the substrate 11, and the wiring of each of the second leads 5 may be set according to the actual need, as long as it is possible to realize that each of the positive pads 13 is electrically connected to the corresponding driving circuit 12 through the second lead 5.

In specific implementation, in the above-mentioned display panel provided by embodiments of the present disclosure, as shown in FIGS. 5, 9, and 10, the second leads 5 electrically connected to some positive pads 13 (e.g., in the first, second, and fifth rows) may be directly routed using the same one metal layer, but the second leads 5 electrically connected to the positive pads 13 in the third row has an overlapping region with the second leads 5 corresponding to the positive pads 13 in the fourth row, and the second leads 5 electrically connected to the positive pads 13 in the fourth row has an overlapping region with the second leads 5 corresponding to the positive pads 13 in the fifth row, i.e., at least part of the second leads 5 has an overlapping region with other second leads 5. If the second leads 5 electrically connected to the positive pads 13 in the third and fourth rows is routed using the same one metal layer, the positive pads 13 will short-circuit with the second leads 5 that are correspond to the fourth and fifth rows and electrically connected to them, so that the second leads 5 electrically connected to the positive pads 13 in the third and fourth rows needs to be bridged in an overlapping region of the second leads 5 electrically connected to the positive pads 13 in the third and fourth rows and the second leads 5 electrically connected to the other rows, so for the two second leads 5 having the overlapping region (e.g., the second lead 5 electrically connected to the first positive pad 13 from the left of the fourth row and the second lead 5 electrically connected to the second positive pad 13 from the left of the fifth row have an overlapping region), one of the two second leads 5 needs to be bridged by a bridging portion 6 in the overlapping region, for example, the second lead 5 electrically connected to the second positive pad 13 from the left of the fifth row is routed with one metal layer, and the second lead 5 electrically connected to the first positive pad 13 from the left of the fourth row needs to be routed with two layers of metal layers, i.e., it is routed in the non-overlapping region (on both sides of the overlapping region) with the same one metal layer as that of the second lead 5 electrically connected to the second positive pad 13 from the left of the fifth row, and is routed using another metal layer in the overlapping region.

Figure 11:
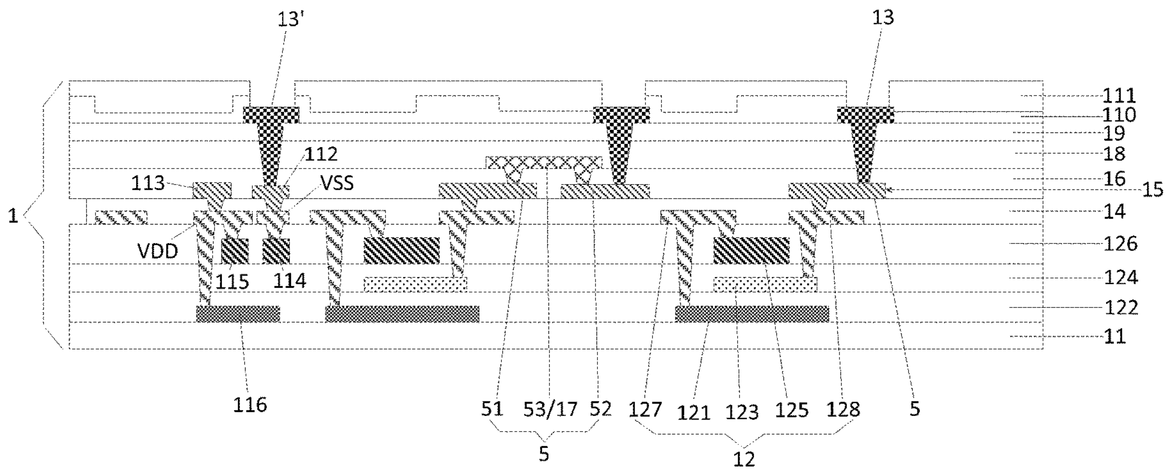
FIG. 11 is a partial structure in FIG. 5.

In specific implementation, in the above-mentioned display panel provided in embodiments of the present disclosure, as shown in FIG. 5 and FIG. 11, FIG. 11 is only a partial structure in FIG. 5 for the purpose of clearly illustrating the structure of the driving backplane. The driving backplane 1 further includes a first insulating layer 14, a first metal layer 15, a second insulating layer 16, and a second metal layer 17 sequentially stacked between the driving circuits 12 and the positive pads 13, and the first insulating layer 14 is close to the driving circuit 12; where a part of the second leads 5 (e.g., the second leads 5 on the right side in FIG. 11) are arranged in the first metal layer 15; another part of the second leads 5 (e.g., the second leads 5 on the left side in FIG. 11) includes a first sub-lead(s) 51, a bridging portion(s) 53, and a second sub-lead(s) 52, the first sub-lead 51 and the second sub-lead 52 are arranged in the first metal layer 15, and the bridging portion 53 is arranged in the second metal layer 17; where one end of the first sub-lead 51 is electrically connected to the driving circuit 12 through a via hole penetrating the first insulating layer 14 and the other end of the first sub-lead 51 is electrically connected to one end of the bridging portion 53 through a via hole penetrating the second insulating layer 16, one end of the second sub-lead 52 is electrically connected to the other end of the bridging portion 53 through the via hole penetrating the second insulating layer 16 and the other end of the second sub-lead 52 is electrically connected to the positive pad 13. For example, in FIG. 10, the second lead 5 electrically connected to the second positive pad 13 from the left in the fifth row is located in the first metal layer 15, and the second lead 5 electrically connected to the first positive pad 13 from the left in the fourth row includes a first sub-lead 51, a bridging portion 53, and a second sub-lead 52.

Figure 13:
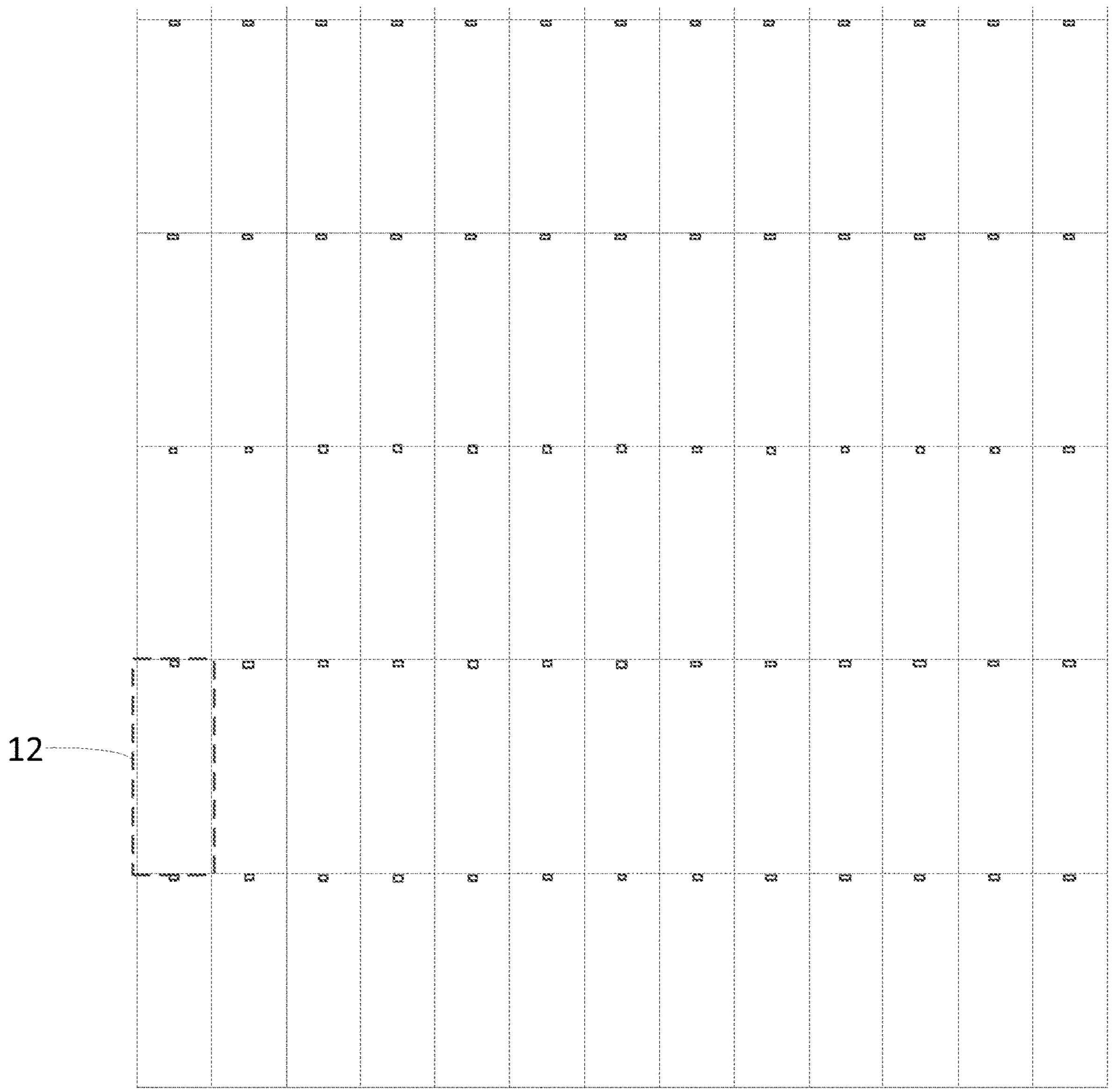
FIG. 13 is a schematic plane diagram of the driving circuit 12 in FIG. 10.
Figure 14:
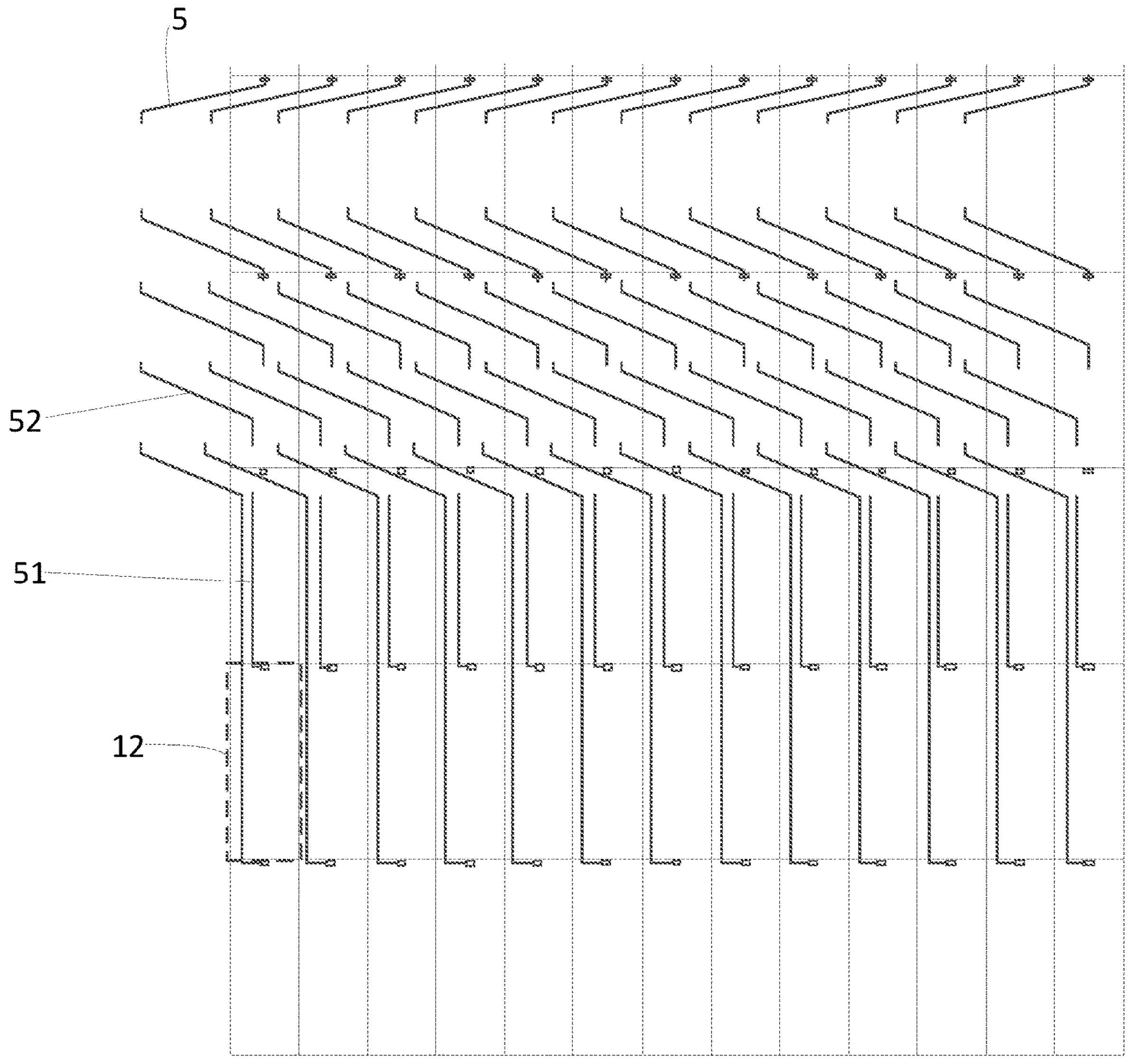
FIG. 14 is a schematic plane diagram in which the first metal layer in FIG. 10 is set to include a second lead, a first sub-lead and a second sub-lead on the basis of FIG. 13.
Figure 15:
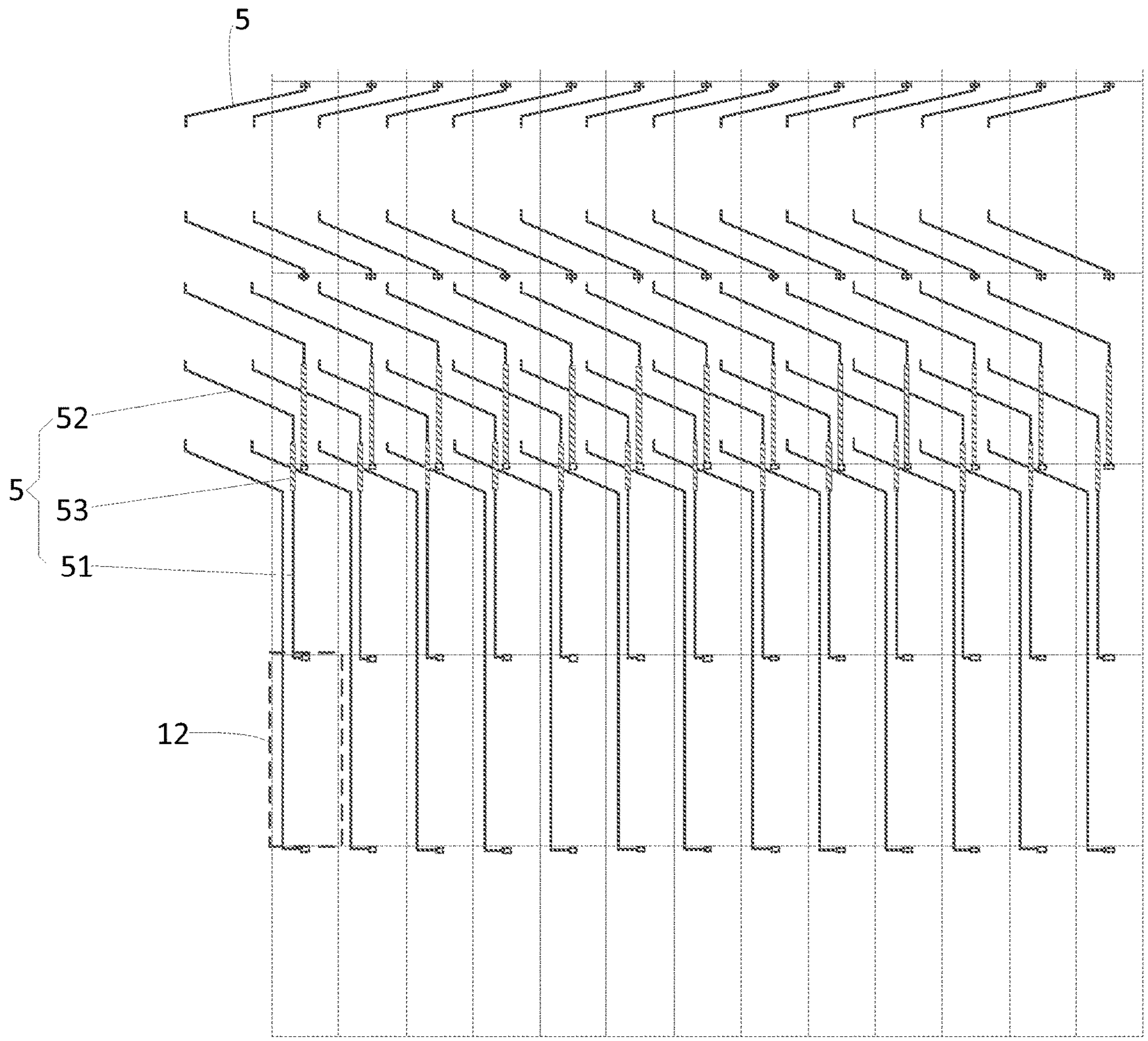
FIG. 15 is a schematic plane diagram of setting the second metal layer (bridging portion) in FIG. 10 on the basis of FIG. 14.

As shown in FIGS. 13-15, in order to more clearly illustrate the driving circuit 12, the first metal layer 15, and the second metal layer 17 in FIG. 10, FIG. 13 shows a schematic plane diagram of the driving circuit 12 in FIG. 10, with a plurality of small square boxes in FIG. 13 representing the subsequent locations where the second leads 5 are connected to the driving circuits 12, FIG. 14 is a schematic plane diagram in which the first metal layer in FIG. 10 is set to include a second lead 5, a first sub-lead 51 and a second sub-lead 52 on the basis of FIG. 13, FIG. 15 is a schematic plane diagram of setting the second metal layer (bridging portion 53) in FIG. 10 on the basis of FIG. 14, and FIG. 10 shows a schematic plane diagram of setting the positive pad 13 on the basis of FIG. 15.

In specific implementation, in the above-described display panel provided in embodiments of the present disclosure, as shown in FIGS. 5 and 11, the driving backplane 1 further includes: a first planarization layer 18 between the second metal layer 17 and the positive pads 13, and a third insulating layer 19 between the first planarization layer 18 and the positive pads 13; and the other end of the second sub-lead 52 is electrically connected to the positive pad 13 through a via hole sequentially penetrating the second insulating layer 16, the first planarization layer 18 and the third insulating layer 19.

Specifically, as shown in FIGS. 5 and 11, the second lead directly arranged in the first metal layer 15 is electrically connected to the positive pad 13 through a via hole sequentially penetrating the second insulating layer 16, the first planarization layer 18, and the third insulating layer 19.

Figure 12:
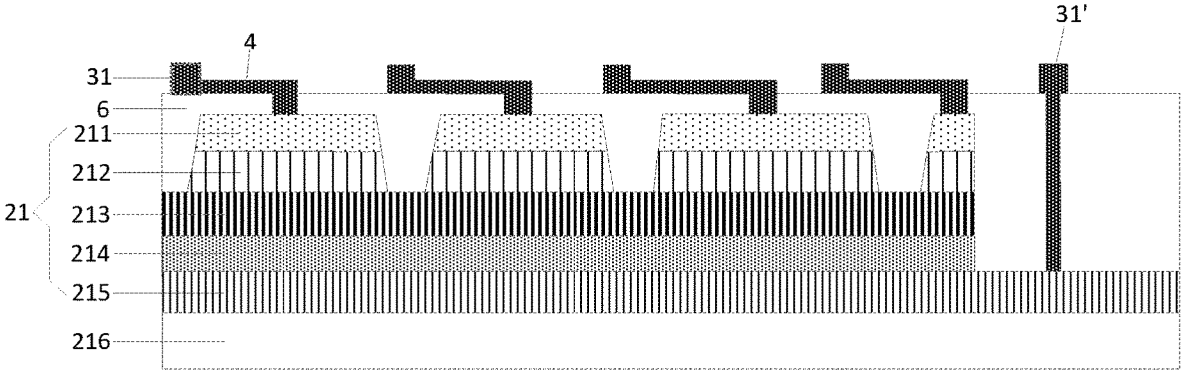
FIG. 12 is a partial structure in FIG. 5.

In specific implementation, in the above-described display panel provided by embodiments of the present disclosure, as shown in FIG. 5 and FIG. 12, FIG. 12 is a partial structure in FIG. 5 only for the purpose of clearly schematizing the structure of the pixel island, each first sub-pixel 21 includes a first electrode 211 (i.e., an electrode P), a first semiconductor layer 212 (i.e., a P-type semiconductor layer), a quantum well layer 213, a second semiconductor layer 214 (i.e., an N-type semiconductor layer), and a second electrode 215 (i.e., an N-electrode) that are stacked, and the first electrode 211 is close to the driving backplane 1.

The display panel further includes a fourth insulating layer 6 between the first electrode 211 and the first electrode pad 31, one end of the first lead 4 is electrically connected to the first electrode pad 31, and the other end of the first lead 4 is electrically connected to the first electrode 211 through a via hole penetrating the fourth insulating layer 6.

It is to be noted that FIGS. 6 and 7 are illustrated with subdivided first electrodes 211 illustrating the first sub-pixels 21, the first electrode pads 31 are arranged in an array on the subdivided first electrodes 211, and between the first electrode pad 31 and the first electrode 211 has a fourth insulating layer 6.

Figure 16:
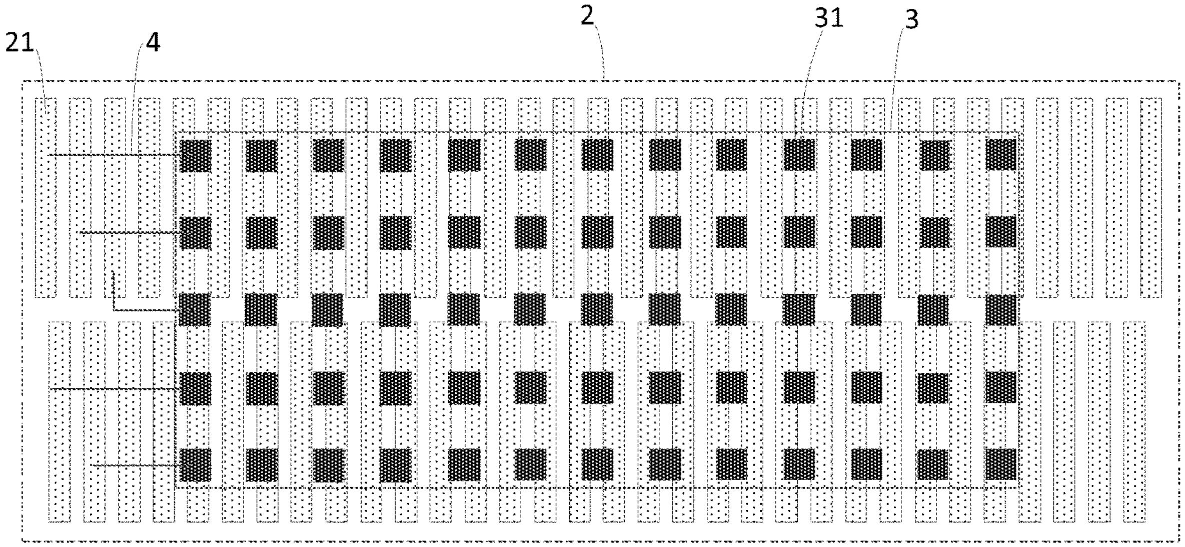
FIG. 16 is another schematic plane diagram corresponding to one pixel island in FIG. 6.

It should be noted that FIG. 7 is illustrated with the shape of the subdivided first electrode 211 as a parallelogram, but of course the shape of the subdivided first electrode 211 may also be a rectangle as shown in FIG. 16, which is not limited herein.

In specific implementation, in the above-described display panel provided in embodiments of the present disclosure, as shown in FIGS. 5 and 12, the pixel island further includes a sapphire substrate 216 on a side of the second electrodes 215 facing away from the first electrode pads 31, and a buffer layer (not shown) between the sapphire substrate 216 and the second electrodes 215.

Optionally, the material of the buffer layer may be gallium nitride (GaN), the material of the first semiconductor layer 212 may be p-GaN, and the material of the second semiconductor layer 214 may be n-GaN.

In specific implementation, in the above-described display panel provided in embodiments of the present disclosure, as shown in FIGS. 5 and 12, the first electrode pads 31 and the first leads 4 may be provided in the same layer. In this way, it is only necessary to change the original compositional pattern when forming the first electrode pads 31, and the pattern of the first leads 4 and the first electrode pads 31 can be formed by a single mask patterning process without adding a separate process for preparing the first lead 4, which can simplify the preparation process, save production costs, and improve production efficiency.

In specific implementation, in the above-described display panel provided in embodiments of the present disclosure, as shown in FIGS. 5 and 12, quantum well layers 213 of the first sub-pixels 21 in the same one pixel island may be an integrated structure, second semiconductor layers 214 of the first sub-pixels 21 in the same one pixel island may be an integrated structure, and second electrodes 215 of the first sub-pixels 21 in the same one pixel island may be an integrated structure. That is, the first sub-pixels 21 in the same one pixel island share the quantum well layer 213, the second semiconductor layer 214, and the second electrode 215, and different first sub-pixels 21 are defined by splitting the first semiconductor layer 212 and the first electrode 211.

In specific implementation, in the above-described display panel provided in embodiments of the present disclosure, as shown in FIGS. 5, 6, and 12, the display panel further includes second electrode pads 31' provided in the same one layer as the first electrode pads 31, where second electrodes 215 in the same one pixel island are electrically connected to the same one second electrode pad 31', and second electrodes 215 in different pixel islands are electrically connected to different second electrode pads 31'. That is, the first sub-pixels 21 in the same one pixel island share the second electrode pad 31'.

In specific implementation, in the above-described display panel provided by embodiments of the present disclosure, as shown in FIG. 6, the second electrode pads 31' may be arranged in a region between two adjacent columns of the first electrode pad sets 3.

In specific implementation, in the above-described display panel provided by embodiments of the present disclosure, as shown in FIG. 5 and FIGS. 8-11, the driving backplane 1 further includes negative pads 13' arranged in the same one layer as the positive pads 13, and the negative pad 13' is bonded and connected to the second electrode pads 31'. That is, the positions of the negative pads 13' are in a one-to-one correspondence with the positions of the second electrode pads 31'.

Optionally, the materials of the positive pad 13 and the negative pad 13' may be bonded metals such as electroplated Cu. As shown in FIG. 11, a thickness of the electroplated Cu may be greater than or equal to a sum of thicknesses of the second insulating layer 16, the first planarization layer 18, and the third insulating layer 19, to ensure the bonding connection between the first electrode pad 31 and the second electrode pad 31' shown in FIG. 12.

In specific implementation, in the above-described display panel provided in the embodiments of the present disclosure, as shown in FIGS. 5 and 11, the driving backplane 1 further includes: a fifth insulating layer 110 on a side of the positive pads 13 facing away from the substrate 11, and a second planarization layer 111 on a side of the fifth insulating layer 110 facing away from the substrate 11; and the fifth insulating layer 110 and the second planarization layer 111 have a first exposed region(s) exposing the positive pads and a second exposed region(s) exposing the negative pads 13'. The first electrode pads 31 shown in FIG. 12 are bonded and connected to the positive pads 13 through the first exposed region, and the second electrode pads 31' shown in FIG. 12 are bonded and connected to the negative pads 13' through the second exposed region.

In specific implementation, in the above-described display panel provided in embodiments of the present disclosure, as shown in FIGS. 5 and 11, the driving circuit 12 includes a first gate 121, a first gate insulating layer 122, an active layer 123, a second gate insulating layer 124, a second gate 125, an interlayer insulating layer 126, and source and drain electrodes (source electrode 127 and drain electrode 128); one end of the first sub-lead 51 is electrically connected to the drain electrode 128 of the driving circuit 12 through a via hole penetrating the first insulating layer 14, the drain electrode 128 is electrically connected to the active layer 123, and the source electrode 127 of the driving circuit 12 is electrically connected to the first gate 121 and the second gate 125, respectively. The driving circuit 12 provided in the embodiments of the present disclosure adopts a dual-gate structure, which can reduce the leakage current.

In specific implementation, in the above-described display panel provided by embodiments of the present disclosure, as shown in FIGS. 5 and 11, the driving backplane 1 further includes: a first conductive connection portion 112 and a second conductive connection portion 113 arranged in the first metal layer 14, a low-voltage power line VSS and a high-voltage power line VDD arranged in the same one layer as the source and drain electrodes (the source electrode 127 and the drain electrode 128), a third conductive connection portion 114 and a fourth conductive connection portion 115 arranged in the same one layer as the second gate 125, and a shielding electrode 116 arranged in the same one layer as the first gate 121.

The negative pad 13' is electrically connected to the first electrically conductive connection portion 112 through a via hole penetrating the third insulating layer 19, the first planarization layer 18, and the second insulating layer 16, the first conductive connection portion 112 is electrically connected to the low-voltage power line VSS through a via hole penetrating the first insulating layer 14, and the low-voltage power line VSS is electrically connected to the third conductive connection portion 114 through a via hole penetrating the interlayer insulating layer 126, the second conductive connection portion 113 is electrically connected to the high-voltage power line VDD through a via hole penetrating the first insulating layer 14, the high-voltage power line VDD is electrically connected to the fourth conductive connection portion 115 through a via hole penetrating the interlayer insulating layer 126, and the high-voltage power line VDD is electrically connected to the shielding electrode 116 through a via hole penetrating the interlayer insulating layer 126, the second gate insulating layer 124, and the first gate insulating layer 122.

In specific implementation, in the above-described display panel provided in embodiments of the present disclosure, as shown in FIGS. 2 and 9, a plurality of pixel islands 2 are arranged at intervals along a row direction X and a column direction Y. Negative pads 13' electrically connected to the pixel islands 2 in the same one column are electrically connected to the same one low-voltage power line VSS, driving circuits 12 electrically connected to the pixel islands 2 in the same one column are electrically connected to the same one high-voltage power line VDD, and a gap between two adjacent columns of pixel islands 2 is provided with one high-voltage power line VDD and one low-voltage power line VSS.

In specific implementation, in the above-described display panel provided in embodiments of the present disclosure, as shown in FIG. 2, a plurality of first sub-pixels 21 in each pixel island 2 are provided at intervals along the row direction X and the column direction Y. The first sub-pixels 21 in each row in each pixel island 2 are arranged in a staggered manner in sequence along the row direction X, and a distance D1 between adjacent first sub-pixels 21 in the same one row is less than the width W of the first sub-pixel 21 along the row direction X. In this way, more first sub-pixels 21 can be provided in each pixel island 2, and the number of viewpoints can be increased when the display panel is applied to a 3D light field display.

In specific implementation, in the above-described display panel provided by embodiments of the present disclosure, as shown in FIG. 2, a distance D2 between centerlines of any two adjacent first sub-pixels 21 along the column direction Y is equal.

Figure 17:
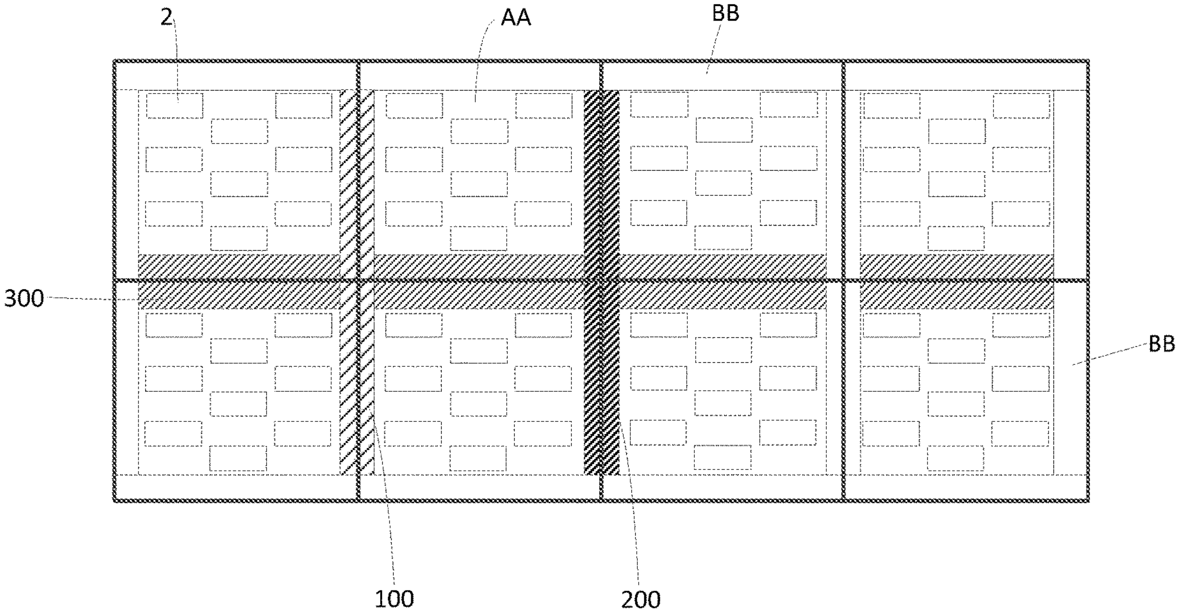
FIG. 17 is another schematic plane diagram of the display panel provided by embodiments of the present disclosure.

In specific implementation, the display panel provided by embodiments of the present disclosure can be applied to a large-size ultra-multiple viewpoint 3D light field display, it will be necessary to splice a plurality of small-size screens to form a large-size display, and the gaps between the spliced screens will make the 3D viewpoint display effect discontinuous. In order to avoid the gaps in the splicing, in the above-described display panel provided by embodiments of the present disclosure, as illustrated in FIG. 17, FIG. 17 is a planar schematic diagram of the display panel, the display panel 1000 further includes a splicing region BB surrounding the display region AA, each square blanking region in FIG. 17 includes a driving backplane structure corresponding to 9 pixel islands 2 shown in FIG. 9. The display panel further includes a GOA driving circuit 100 (a gate scan line driving circuit), an EOA driving circuit 200 (a light emitting scan line driving circuit), and a MUX circuit 300 (multiplexer), the GOA driving circuit 100 and the EOA driving circuit 200 are arranged between adjacent two different columns of pixel units, and the MUX circuit 300 is arranged between adjacent two rows of pixel units. In the present disclosure, by setting the GOA driving circuit 100 and the EOA driving circuit 200 between adjacent two different columns of pixel units, there is no need to make the GOA driving circuit 100, the EOA driving circuit 200 and the MUX circuit 300 be in a peripheral region of the driving backplane 1 and there is no need to reserve a border for making a driving circuit(s) for the driving backplane, which solves the problems in the existing solutions of display panel borders, and image segmentation and image discontinuity after splicing large-sized display screens. In the present disclosure, a splicing region BB for the upper, lower, left, and right edges of small-sized display screens may be reserved, which can be used for glass cutting, grinding, and other losses, and can achieve seamless splicing of various display screens.

Specifically, as shown in FIG. 17, assuming that a position where the driving circuit 100 is located between two adjacent columns of pixel units is a first position, and a position where the EOA driving circuit 200 is located between two adjacent columns of pixel units is a second position, FIG. 17 in the embodiments of the present disclosure is based on an example of one column of pixel units arranged between the first position and the second position, and, of course, two or three columns of pixel units, and the like may be arranged between the first and second positions.

Optionally, the flexible circuit board (FPC) and the driving chip (IC) in the driving backplane may be bent to the backside of the driving backplane for fabrication using side wiring and backside bonding processes.

In specific implementation, in the above-described display panel provided by embodiments of the present disclosure, the pixel islands may be Mini LED pixel islands.

Based on the same inventive concept, embodiments of the present disclosure further provide a display device including at least one above-described display panel provided in embodiments of the present disclosure. Since the display device solves the problem in a similar principle as one of the aforementioned display panel, the implementation of the display device can be referred to the implementation of the aforementioned display panel, and the repetition will not be repeated.

Figure 18:
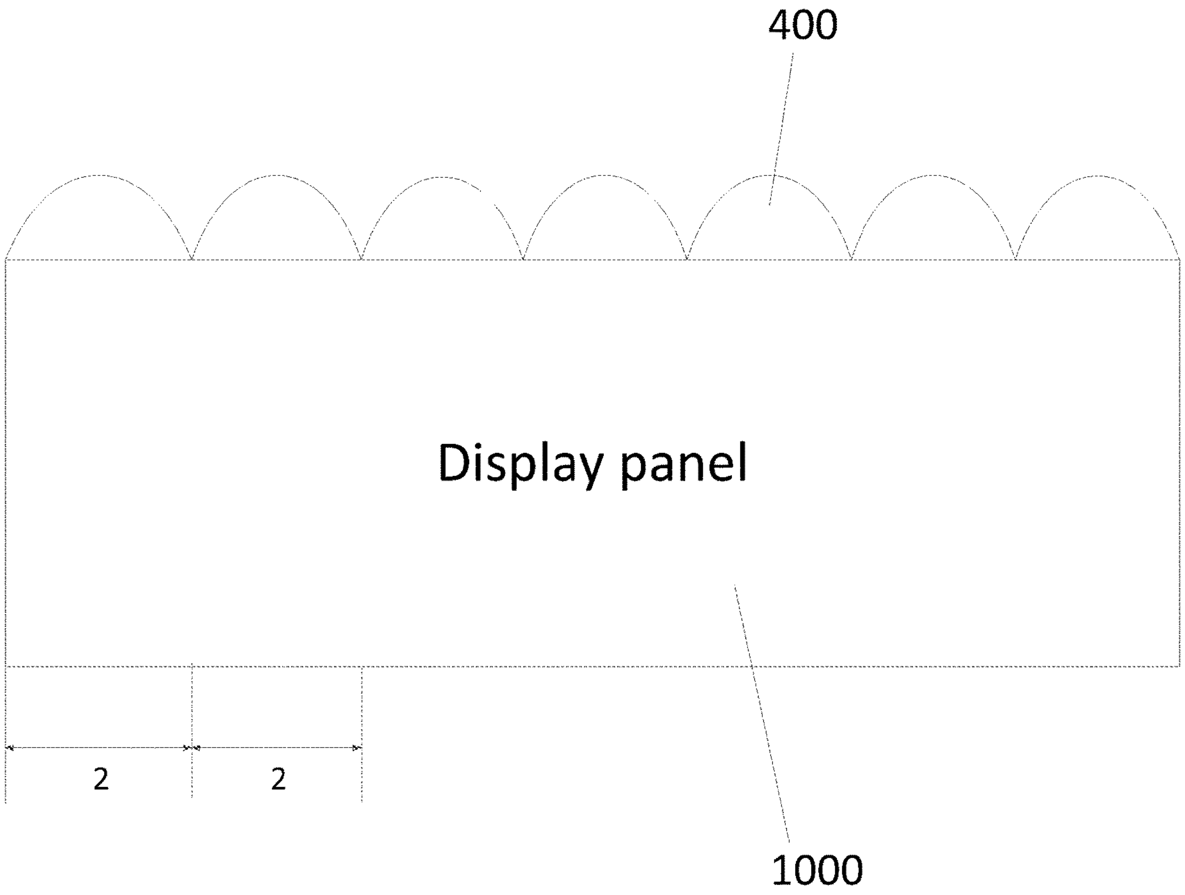
FIG. 18 is a schematic structural diagram of a display device provided by embodiments of the present disclosure.
Figure 19:
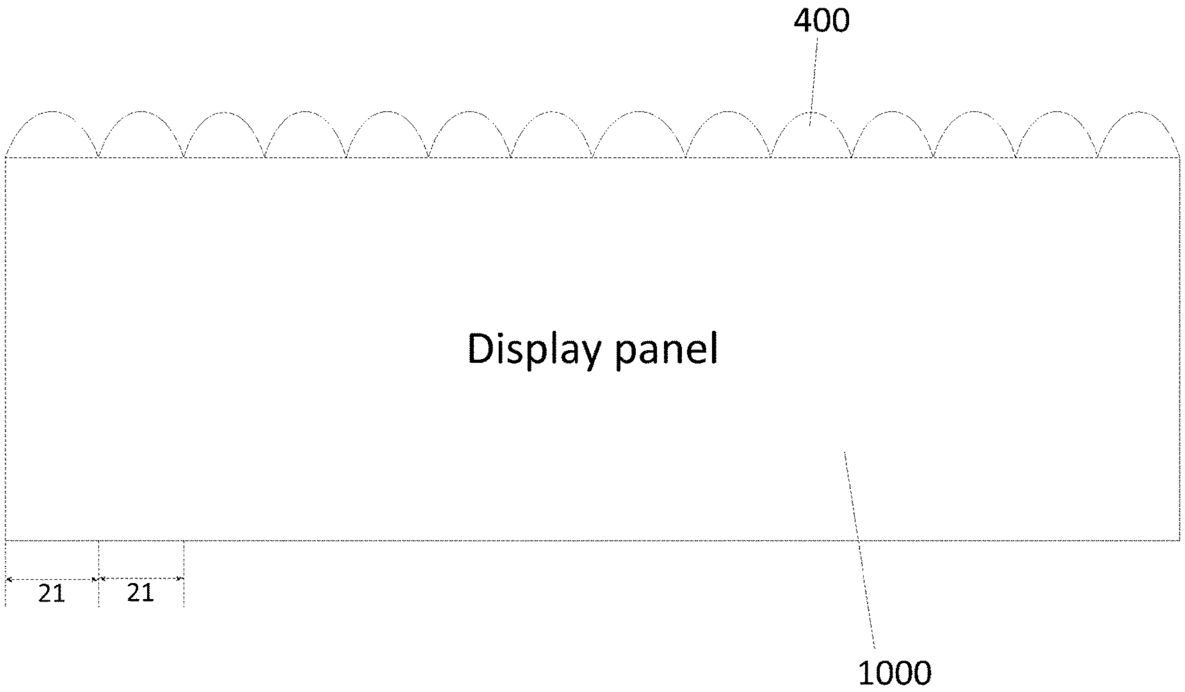
FIG. 19 is another schematic structural diagram of the display device provided by embodiments of the present disclosure.

In specific implementation, in the above-described display device provided in the embodiments of the present disclosure, as shown in FIGS. 18 and 19, the display device further includes a plurality of lenses 400 on a light emergent side of the display panel 1000; and the lenses 400 may be microlenses.

As shown in FIG. 18, the plurality of lenses 400 are in a one-to-one correspondence with the plurality of pixel islands 2, or, as shown in FIG. 19, the lenses 400 are in a one-to-one correspondence with the first sub-pixels 21 in each pixel island 2.

Light emitted from each first sub-pixel 21 in each pixel island 2 is incident to the corresponding lens 400.

Figure 20:
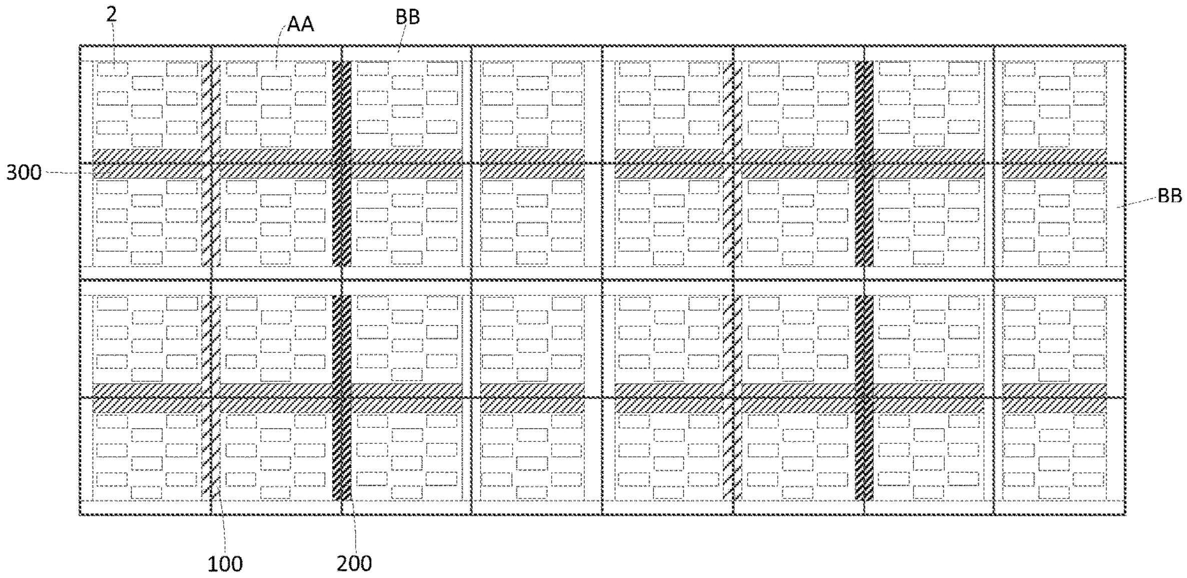
FIG. 20 is a schematic structural diagram of a splicing display device provided by embodiments of the present disclosure.

In specific implementation, in the above-described display device provided by embodiments of the present disclosure, as shown in FIG. 20, the display panel 1000 further includes a splicing region BB surrounding the display region AA, and the display device includes at least two display panels arranged that are spliced (for example, a splicing of four of the display panels 1000 shown in FIG. 17), and splicing regions BB of the at least two display panels are provided with a plurality of second sub-pixels (not shown) arranged in the same manner as the first sub-pixels 21. In this way, the arrangement of the second sub-pixels of the splicing region BB can be set in the same way as the arrangement of the first sub-pixels 21 in the display panels, and the splicing region BB can also realize a normal display, so that the spliced display panels are continuously displayed.

In the light field display device shown in FIGS. 18 and 19 of the present disclosure embodiments, each pixel island includes a plurality of first sub-pixels, and each pixel island can provide a sufficiently large number of subdivided viewpoints, and the lenses converge the light field information, so that a continuous 3D light field display effect can be formed.

Specifically, the display device provided by embodiments of the present disclosure may be a large-size ultra-multiple viewpoint 3D light field display screen, for example, used in a movie theater/mall advertisement screen/multimedia conference room/outdoor advertisement screen, to provide a large view angle and large main flap of the multi-viewpoint light field display effect that can be viewed by multiple people.

Embodiments of the present disclosure provide a display panel and a display device, by setting the number of rows of the first electrode pads in the first electrode pad set corresponding to each pixel island to be greater than the number of rows of the first sub-pixels in each pixel island, and setting the number of columns of the first electrode pads in the first electrode pad set corresponding to each pixel island to be less than the number of columns of the first sub-pixels in each pixel island, so as to rearrange the plurality of first electrode pads originally required to be provided one-to-one correspondingly and vertically above each first sub-pixel of each pixel island. For example, in the embodiments of the present disclosure, each pixel island includes 65 first sub-pixels which are set in 2 rows, where a first row includes 33 first sub-pixels, and a second row includes first sub-pixels. By arranging the 65 first electrode pads corresponding to each pixel island into rows and columns, and electrically connecting each first electrode pad to the corresponding first sub-pixel through the first lead, the problem in the related art of insufficiently fabricating the first electrode pads in a one-to-one correspondence with the first sub-pixels vertically above the respective first sub-pixels can be solved.

Although preferred embodiments of the present disclosure have been described, those embodiments can be additionally changed and modified by those skilled in the art once the basic inventive concepts are known. Therefore, the appended claims are intended to be construed to include the preferred embodiments as well as all changes and modifications that fall in the scope of the present disclosure.

Obviously, a person skilled in the art can make various changes and variations to the embodiments of the present disclosure without departing from the spirit and scope of the embodiments of the present disclosure. Thus, if such modifications and variations of the embodiments of the present disclosure fall in the scope of the presently disclosed claims and their technical equivalents, the present disclosure is intended to include such modifications and variations.

What is claimed is:

1. A display panel, comprising a display region, wherein in the display region, the display panel comprises:

a driving backplane comprising a substrate, a plurality of driving circuits arranged in array on the substrate, and a plurality of positive pads arranged on a side of the driving circuits facing away from the substrate;

a plurality of pixel islands on the driving backplane, wherein each pixel island comprises a plurality of first sub-pixels with the same color; and a plurality of first electrode pad sets between the plurality of pixel islands and the driving backplane, wherein the first electrode pad sets is in a one-to-one correspondence with the pixel islands, an orthographic projection of a first electrode pad set on the substrate is located in an orthographic projection of a pixel island corresponding to the first electrode pad set on the substrate, each first electrode pad set comprises a plurality of first electrode pads, and the first electrode pads is bonded and connected to the positive pads; wherein a number of rows of first electrode pads in each first electrode pad set is greater than a number of rows of first sub-pixels in each pixel island, and a number of columns of first electrode pads in each first electrode pad set is less than a number of columns of first sub-pixels in each pixel island; and the first electrode pads are electrically connected to the first sub-pixels through first leads, and the positive pads are electrically connected to the driving circuits through second leads.

2. The display panel according to claim 1, wherein the plurality of positive pads are divided into a plurality of positive pad sets, and the positive pad sets are in a one-to-one correspondence with the first electrode pad sets; and the plurality of driving circuits are divided into a plurality of driving circuit sets, the driving circuit sets are in a one-to-one correspondence with the positive pad sets, and an area of an orthographic projection of each positive pad set on the substrate is smaller than an area of an orthographic projection of a driving circuit set on the substrate.

3. The display panel according to claim 2, wherein an orthographic projection of a second lead on the substrate is located in an orthographic projection of a gap between two adjacent rows of first sub-pixels on the substrate, and/or an orthographic projection of a second lead on the substrate is located in an orthographic projection of a gap between two adjacent columns of first sub-pixels on the substrate.

4. The display panel according to claim 3, wherein at least part of the second leads have an overlapping region with other second leads, and for two second leads having the overlapping region, one of the two second leads is bridged by a bridging portion at the overlapping region.

5. The display panel according to claim 1, wherein the driving backplane further comprises a first insulating layer, a first metal layer, a second insulating layer, and a second metal layer sequentially stacked between the driving circuits and the positive pads, and the first insulating layer is close to the driving circuit; wherein a part of the second leads are arranged in the first metal layer; and another part of the second leads comprise first sub-leads, bridging portions and second sub-leads, the first sub-leads and the second sub-leads are both arranged in the first metal layer, and the bridging portions are arranged in the second metal layer;

wherein one end of a first sub-lead is electrically connected to the driving circuit through a via hole penetrating the first insulating layer and an other end of the first sub-lead is electrically connected to one end of a bridging portion through a via hole penetrating the second insulating layer, and one end of a second sub-lead is electrically connected to an other end of the bridging portion through a via hole penetrating the second insulating layer and an other end of the second sub-lead is electrically connected to a positive pad.

6. The display panel according to claim 5, wherein the driving backplane further comprises: a first planarization layer between the second metal layer and the positive pads, and a third insulating layer between the first planarization layer and the positive pads; and the other end of the second sub-lead is electrically connected to the positive pad through a via hole sequentially penetrating the second insulating layer, the first planarization layer and the third insulating layer.

7. The display panel according to claim 6, wherein each first sub-pixel comprises a first electrode, a first semiconductor layer, a quantum well layer, a second semiconductor layer, and a second electrode that are stacked, and the first electrode is close to the driving backplane; and the display panel further comprises a fourth insulating layer between the first electrode and the first electrode pad, one end of the first lead is electrically connected to the first electrode pad, and the other end of the first lead is electrically connected to the first electrode through a via hole penetrating the fourth insulating layer.

8. The display panel according to claim 7, wherein the first electrode pad is provided in the same one layer as the first lead.

9. The display panel according to claim 7, wherein quantum well layers of the first sub-pixels in the same one pixel island are an integrated structure, second semiconductor layers of the first sub-pixels in the same one pixel island are an integrated structure, and second electrodes of the first sub-pixels in the same one pixel island are an integrated structure.

10. The display panel according to claim 7, further comprising second electrode pads provided in the same one layer as the first electrode pads, wherein second electrodes in the same one pixel island are electrically connected to the same one second electrode pad, and second electrodes in different pixel islands are electrically connected to different second electrode pads.

11. The display panel according to claim 10, wherein the second electrode pads are located in a region between two adjacent columns of first electrode pad sets.

12. The display panel according to claim 10, wherein the driving backplane further comprises negative pads arranged in the same one layer as the positive pads, and the negative pads are bonded and connected to the second electrode pads.

13. The display panel according to claim 12, wherein the driving backplane further comprises: a fifth insulating layer on a side of the positive pads facing away from the substrate, and a second planarization layer on a side of the fifth insulating layer facing away from the substrate; the fifth insulating layer and the second planarization layer have a first exposed region exposing the positive pads and a second exposed region exposing the negative pads, and the first electrode pads are bonded and connected to the positive pads through the first exposed region and the second electrode pads are bonded and connected to the negative pads through the second exposed region.

14. The display panel according to claim 13, wherein each driving circuit comprises a first gate, a first gate insulating layer, an active layer, a second gate insulating layer, a second gate, an interlayer insulating layer, and source and drain electrodes sequentially stacked between the substrate and the first insulating layer; and one end of the first sub-lead is electrically connected to the drain electrode of the driving circuit through the via hole penetrating the first insulating layer, the drain electrode is electrically connected to the active layer, and the source electrode of the driving circuit is electrically connected to the first gate and the second gate.

15. The display panel according to claim 14, wherein the driving backplane further comprises: a first conductive connection portion and a second conductive connection portion arranged in the first metal layer, a low-voltage power line and a high-voltage power line arranged in the same one layer as the source and drain electrodes, a third conductive connection portion and a fourth conductive connection portion arranged in the same one layer as the second gate, and a shielding electrode arranged in the same one layer as the first gate; and the negative pad is electrically connected to the first conductive connection portion through a via hole penetrating the third insulating layer, the first planarization layer and the second insulating layer, the first conductive connection portion is electrically connected to the low-voltage power line through a via hole penetrating the first insulating layer, the low-voltage power line is electrically connected to the third conductive connection portion through a via hole penetrating the interlayer insulating layer, the second conductive connection portion is electrically connected to the high-voltage power line through a via hole penetrating the first insulating layer, the high-voltage power line is electrically connected to the fourth conductive connection portion through a via hole penetrating the interlayer insulating layer, and the high-voltage power line is electrically connected to the shielding electrode through a via hole penetrating the interlayer insulating layer, the second gate insulating layer and the first gate insulating layer.

16. The display panel according to claim 15, wherein the plurality of pixel islands are arranged at intervals along a row direction and a column direction, the negative pads electrically connected to the pixel islands in the same one column are electrically connected to the same one low-voltage power line, the driving circuits electrically connected to the pixel islands in the same one column are electrically connected to the same one high-voltage power line, and one high-voltage power line and one low-voltage power line is provided at a gap between two adjacent columns of pixel islands.

17. The display panel according to claim 1, comprising a plurality of rows and columns of pixel units with different light-emitting colors, wherein the pixel units in the same one row have the same light-emitting color, and the pixel units with different light-emitting colors in the same one column are arranged alternately; and each pixel unit comprises at least two pixel islands arranged at intervals, the at least two pixel islands in each pixel unit are staggered in a row direction, and outermost adjacent first sub-pixels of adjacent pixel islands in each pixel unit are staggered in the row direction.

18. The display panel according to claim 17, wherein the plurality of first sub-pixels in each pixel island are arranged at intervals along the row direction and a column direction, each row of first sub-pixels in each pixel island are sequentially staggered along the row direction, and a distance between adjacent first sub-pixels in the same one row is smaller than a width of the first sub-pixel along the row direction.

19. The display panel according to claim 1, wherein the pixel islands are mini light-emitting diode (LED) pixel islands.

20. A display device, comprising at least one display panel according to claim 1.

* * * * *